(12) United States Patent
Chen

(10) Patent No.: US 12,707,993 B2
(45) Date of Patent: Aug. 11, 2026

(54) PACKAGE STRUCTURE AND METHOD OF MANUFACTURING THE SAME

(71) Applicant: Advanced Semiconductor Engineering, Inc., Kaohsiung (TW)

(72) Inventor: Ying-Chung Chen, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 664 days.

(21) Appl. No.: 18/098,560

(22) Filed: Jan. 18, 2023

(65) Prior Publication Data

US 2024/0243039 A1 Jul. 18, 2024

(51) Int. Cl.

| | |
|---|---|
| ***H10W 70/40*** | (2026.01) |
| ***H10W 72/00*** | (2026.01) |
| ***H10W 72/50*** | (2026.01) |
| ***H10W 74/01*** | (2026.01) |
| ***H10W 74/10*** | (2026.01) |
| ***H10W 90/00*** | (2026.01) |
| *H10W 72/30* | (2026.01) |
| *H10W 72/59* | (2026.01) |
| *H10W 72/90* | (2026.01) |
| *H10W 74/00* | (2026.01) |

(52) U.S. Cl.

CPC ....... *H10W 70/465* (2026.01); *H10W 72/015* (2026.01); *H10W 72/50* (2026.01); *H10W 74/01* (2026.01); *H10W 74/141* (2026.01); *H10W 90/00* (2026.01); *H10W 72/07552* (2026.01); *H10W 72/07554* (2026.01); *H10W 72/342* (2026.01); *H10W 72/527* (2026.01); *H10W 72/547* (2026.01); *H10W 72/59* (2026.01); *H10W 72/9415* (2026.01); *H10W 74/00* (2026.01); *H10W 90/732* (2026.01); *H10W 90/755* (2026.01)

(58) Field of Classification Search

CPC . H01L 23/4952; H01L 21/4885; H01L 21/56; H01L 23/3185; H01L 23/49; H01L 24/05; H01L 24/29; H01L 24/32; H01L 24/43; H01L 24/48; H01L 24/49; H01L 25/0657; H01L 2224/04042; H01L 2224/05568; H01L 2224/29023; H01L 2224/32145; H01L 2224/48091; H01L 2224/48177; H01L 2224/48179; H01L 2224/4903; H01L 2224/49107; H01L 2924/182; H01L 21/561; H01L 21/568; H01L 23/3107; H01L 23/49548; H01L 24/45; H01L 24/85

See application file for complete search history.

(56) References Cited

U.S. PATENT DOCUMENTS

2015/0194322 A1* 7/2015 Rogren ............ H01L 23/49548 438/123
2016/0005679 A1* 1/2016 Israel ............... H01L 23/49827 257/368

(Continued)

*Primary Examiner* — Jeff W Natalini
*Assistant Examiner* — Nicholas Leland Hutson
(74) *Attorney, Agent, or Firm* — Foley and Lardner LLP

(57) ABSTRACT

At least some embodiments of the present disclosure relate to an electronic structure. The package structure includes a lead frame, an electronic component, and a conductive wire physically and electrically connecting the electronic component to the lead frame. An elevation of a first end of the conductive wire is substantially equal to an elevation of a second end of the conductive wire.

23 Claims, 36 Drawing Sheets

(56) References Cited

U.S. PATENT DOCUMENTS

| | | | | |
|---|---|---|---|---|
| 2018/0148316 | A1* | 5/2018 | Duqi | G01L 1/26 |
| 2018/0162722 | A1* | 6/2018 | Male | B81B 7/0048 |
| 2019/0326201 | A1* | 10/2019 | Gomez | H01L 23/49548 |
| 2021/0057355 | A1* | 2/2021 | Arellano | H01L 23/3114 |
| 2021/0118818 | A1* | 4/2021 | Cadag | H01L 23/4952 |

* cited by examiner

PACKAGE STRUCTURE AND METHOD OF MANUFACTURING THE SAME

BACKGROUND

1. Technical Field

The present disclosure relates generally to a package structure and a method of manufacturing the same. More particularly, the present disclosure relates to a package structure including a lead frame and a method of manufacturing the same.

2. Description of the Related Art

In Flat No leads packaging, such as Quad Flat No leads (QFN), a height of a wire loop and thickness of a molding compound may cause thickening of the package. However, current trends in the industry prefer packages to be as thin as possible.

SUMMARY

In some embodiments, according to one aspect, a package structure includes a lead frame, an electronic component, and a conductive wire physically and electrically connecting the electronic component to the lead frame. An elevation of a first end of the conductive wire is substantially equal to an elevation of a second end of the conductive wire.

In some embodiments, according to another aspect, a package structure includes an electronic component and at least one pin disposed around the electronic component. The at least one pin has a top surface, a bottom surface opposite to the top surface, a first lateral surface extending between the top surface and the bottom surface, and a second lateral surface opposite to the first lateral surface. The first lateral surface faces the electronic component. A roughness of the first lateral surface of the at least one pin is greater than a roughness of the second lateral surface of the at least one pin.

In some embodiments, according to another aspect, a method is disclosed for manufacturing a package structure. The method includes: providing a lead frame, the lead frame defining a space extending through the lead frame; disposing the lead frame on a temporary carrier; attaching an electronic component to the temporary carrier; forming at least one bonding wire to electrically connect the electronic component to the lead frame; encapsulating the lead frame, the at least one bonding wire, and the electronic component with an encapsulant; removing the temporary carrier; and back-etching the lead frame to form a plurality of pins

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1A:
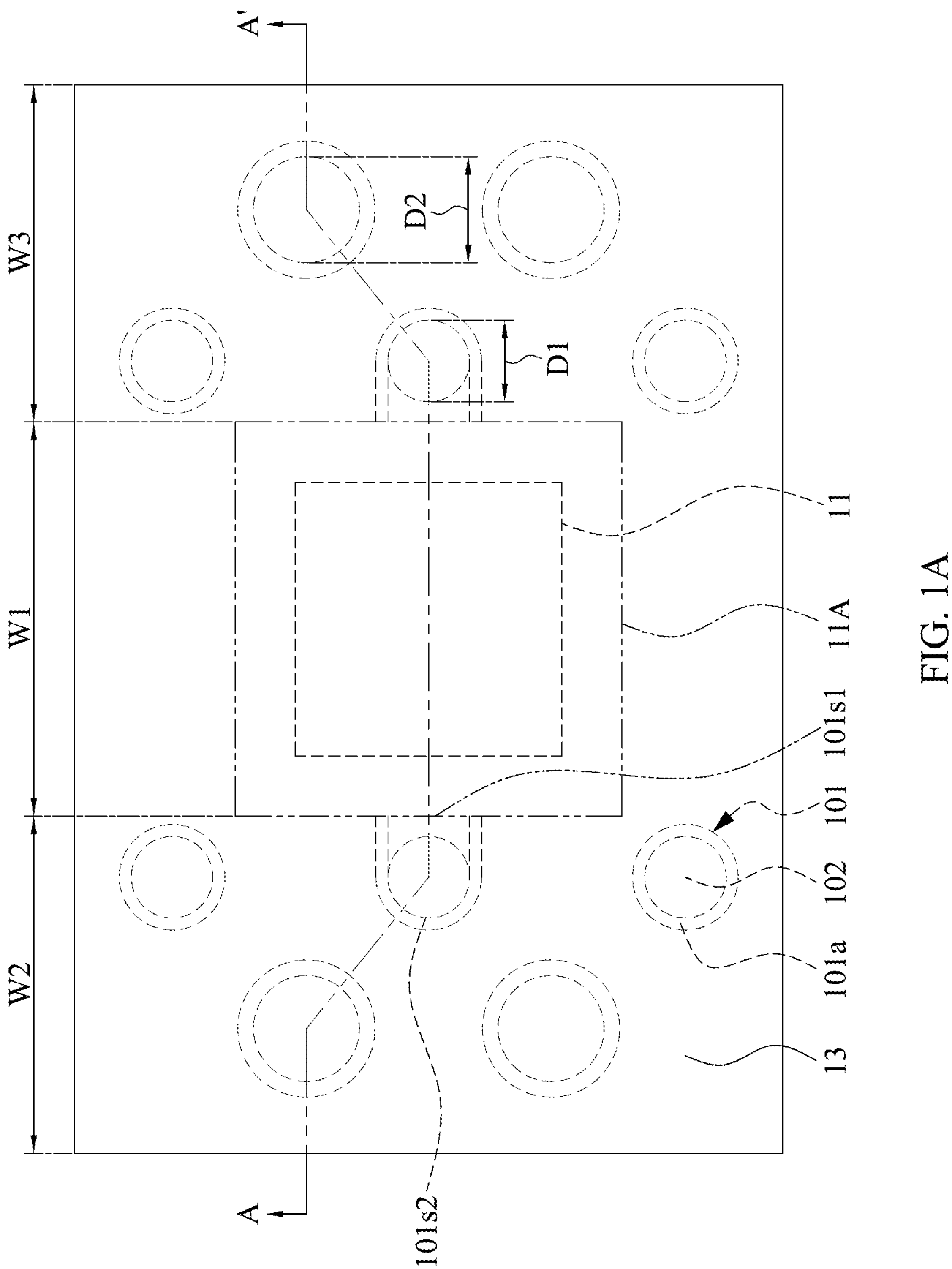
FIG. 1A illustrates a top view of a package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom." "vertical," "horizontal." "side," "higher," "lower," "upper." "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of the embodiments of this disclosure are not deviated from by such arrangement.

Figure 1B:
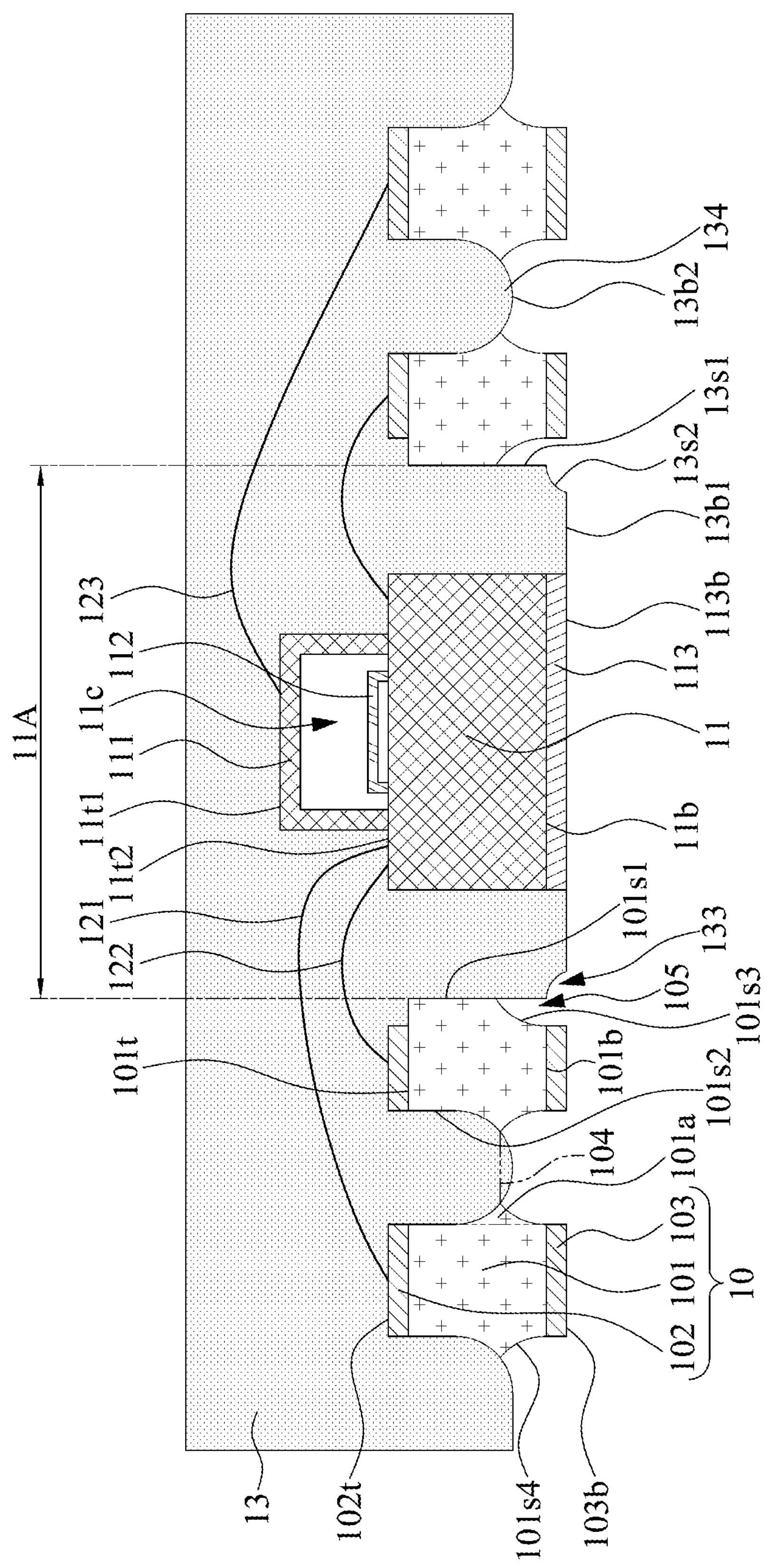
FIG. 1B illustrates a cross-sectional view of the package structure taken along line A-A' of FIG. 1A.

FIG. 1A is a top view of a package structure 1 according to some embodiments of the present disclosure. FIG. 1B is a cross-sectional view of the package structure 1 taken along line A-A' of FIG. 1A. The package structure 1 may be an electronic device, a semiconductor device package or a semiconductor package device.

The package structure 1 may include a lead frame 10, an electronic component 11, a plurality of conductive wires 121, 122, 123 and an encapsulant 13.

The lead frame 10 may include at least one pin 101, at least one conductive pad 102, and at least one conductive pad 103. For example, the lead frame 10 may include a plurality of pins 101, a plurality of conductive pads 102, and a plurality of conductive pads 103. The pins 101 may be physically separated from each other and/or electrically insulated from each other. The conductive pad 102 is disposed on a top surface 101*t* of the pin 101, and may be also referred to as a first conductive pad, a top conductive pad or an upper conductive pad. The conductive pad 102 has a top surface 102*t*. The top surface 102*t* of the conductive pad 102 and a second top surface 11*t*2 of the electronic component 11 may be substantially coplanar with each other. That is, the top surface 102*t* of the conductive pad 102 may be substantially aligned with the second top surface 11*t*2 of the electronic component 11. An elevation of the top surface 102*t* of the conductive pad 102 is substantially equal to an elevation of the second top surface 11*t*2 of the electronic component 11. In addition, the conductive pad 103 is disposed on a bottom surface 101*b* of the pin 101, and may be also referred to as a second conductive pad, a bottom conductive pad or a lower conductive pad. The conductive pad 103 has a bottom surface 103*b*. The bottom surface 103*b* of the conductive pad 103 and a bottom surface 113*b* of an adhesive layer 113 may be substantially coplanar with each other. That is, the bottom surface 103*b* of the conductive pad 103 may be substantially aligned with the bottom surface 113*b* of the adhesive layer 113. In some embodiments, a vertical distance between the top surface 102*t* of the conductive pad 102 and the bottom surface 103*b* of the conductive pad 103 may be substantially equal to a vertical distance between the second top surface 11*t*2 of the electronic component 11 and the bottom surface 113*b* of the adhesive layer 113.

The pin 101 closest to the left side/right side of the electronic component 11 has a top surface 101*t*, a bottom surface 101*b* opposite to the top surface 101*t*, a first lateral surface 101*s*1 connected to the top surface 101*t*, a second lateral surface 101*s*2 connected to the first lateral surface 101*s*1, a third lateral surface 101*s*3 connected to the first lateral surface 101*s*1, and a fourth lateral surface 101*s*4 opposite to the third lateral surface 101*s*3 and connected to the second lateral surface 101*s*2. The first lateral surface 101*s*1 of the pin 101 may be a vertical surface, and may be located above the third lateral surface 101*s*3. The second lateral surface 101*s*2, third lateral surface 101*s*3, and the fourth lateral surface 101*s*4 of the pin 101 may be curved. The second lateral surface 101*s*2 may be located above the fourth lateral surface 101*s*4 so that a lower portion of the second lateral surface 101*s*2 and an upper portion of the fourth lateral surface 101*s*4 may collectly define a protrusion 101*a*. As shown in FIG. 1B, the pin 101 closest to the left side/right side of the electronic component 11 has one protrusion 101*a* facing away the electronic component 11. The conductive pad 102 may partially cover the top surface 101*t* of the pin 101 closest to the left side/right side of the electronic component 11. The conductive pad 103 may completely cover the bottom surface 101*b* of the pin 101 closest to the left side/right side of the electronic component 11.

In some embodiments, the protrusion 101*a* may be a curve portion 101*a* of the pin 101. The curve portion 101*a* has an apex point intersected by the second lateral surface 101*s*2 and the fourth lateral surface 101*s*4. A shape of the curve portion 101*a* may be a bird's beak. An elevation of a horizontal imaginary line 104 between two apexes of two adjacent curve portions 101*a* is between the second top surface 11*t*2 of the electronic component 11 and a bottom surface 11*b* of the electronic component 11. An elevation of the curve portion 101*a* is between the second top surface 11*t*2 and the bottom surface 11*b* of the electronic component 11.

In some embodiments, the conductive pad 102 on the pin 101 closest to the left side/right side of the electronic component 11 has a width D1, and that the conductive pad 102 on the pin 101 far away from the electronic component 11 has a width D2 which is greater than the width D1. In some embodiments, the widths D1, D2 may be the same.

The first lateral surface 101*s*1 and the third lateral surface 101*s*3 face the electronic component 11. A surface roughness (Ra) of the first lateral surface 101*s*1 of the pin 101 may be greater than a surface roughness of the second lateral surface 101*s*2 of the pin 101 since the first lateral surface 101*s*1 of the pin 101 may be formed by punching, and the second lateral surface 101*s*2 of the pin 101 may be formed by etching. Further, the surface roughness of the first lateral surface 101*s*1 of the pin 101 may be greater than a surface roughness of the third lateral surface 101*s*3 of the pin 101 and a surface roughness of the fourth lateral surface 101*s*4 of the pin 101 since the first lateral surface 101*s*1 of the pin 101 may be formed by punching, and the third lateral surface 101*s*3 of the pin 101 and the fourth lateral surface 101*s*4 of the pin 101 may be formed by etching.

A projection of the electronic component 11 may be free from overlapping a projection of the lead frame 10 in a top view. That is, the electronic component 11 may be not disposed on the lead frame 10. There may be no portion of the lead frame 10 located right under the electronic component 11. The electronic component 11 may include a cap 111, a membrane 112, and the adhesive layer 113. The adhesive layer 113 is disposed on the bottom surface 11*b* of the electronic component 11 and exposed to air. In some embodiments, the adhesive layer 113 is a die attach film. The adhesive layer 113 may include a thermosetting resin or a thermoplastic resin. A material of the adhesive layer 113 may be different from a material of the encapsulant 13. The adhesive layer 113 may protect the bottom surface 11*b* of the electronic component 11. In some embodiments, the adhesive layer 113 may be omitted, such that the bottom surface 11*b* of the electronic component 11 is exposed by the encapsulant 13. The cap 111 may have a first top surface 11*t*1 and may define a cavity 11*c*. The cap 111 is disposed over the second top surface 11*t*2 of the electronic component 11 and electrically connected to the second top surface 11*t*2 of the electronic component 11. The membrane 112 is disposed over the second top surface 11*t*2 of the electronic component 11 and in the cavity 11*c*.

In some embodiments, the electronic component 11 may include, e.g., a MEMS package, a MEMS microphone, or a MEMS gas sensor.

The package structure 1 may include a die attach region 11A (or a die security region). The die attach region 11A may be arranged at a central portion of the package structure 1, and the pin(s) 101 may be disposed around the die attach region 11A. In some embodiments, the first lateral surface 101*s*1 of the pin 101 may be a portion of an edge of the die attach region 11A. The electronic component 11 may be disposed in the die attach region 11A. Thus, the electronic component 11 may be disposed between two first lateral surfaces 101*s*1 of the pins 101. The die attach region 11A may be large enough to accommodate the electronic component 11. The pins 101 of the lead frame 10 may be disposed around the electronic component 11. The die attach region 11A has a width W1. In some embodiments, the width W1 may be equal to a distance between two first lateral surfaces 101*s*1 of the pins 101. A distance W2 is defined as a distance between the left side of the die attach region 11A and the left side of the package structure 1. A distance W3 is defined as a distance between the right side of the die attach region 11A and the right side of the package structure 1. The width W1 may be greater than the distance W2. The width W1 may be greater than the distance W3. The distance W2 may be equal to or different from the distance W3.

The conductive wires 121, 122, 123 (or bonding wires) physically and electrically connect the electronic component 11 to the lead frame 10. The conductive wire 121 electrically connects the second top surface 11*t*2 of the electronic component 11 to the top surface 102*t* of conductive pad 102. The conductive wire 122 electrically connects the second top surface 11*t*2 of the electronic component 11 to the top surface 102*t* of the conductive pad 102 closest to the left side/right side of the electronic component 11. An elevation of a first end of the conductive wire 121 at the top surface 102*t* of the conductive pad 102 on the most left side pin 101 is substantially equal to an elevation of a second end of the conductive wire 121 at the second top surface 11*t*2 of the electronic component 11. An elevation of a first end of the conductive wire 122 at the top surface 102*t* of the conductive pad 102 on the pin 101 closest to the left side/right side of the electronic component 11 is substantially equal to an elevation of a second end of the conductive wire 122 at the second top surface 11*t*2 of the electronic component 11. An apex point of the conductive wire 121 is higher than an apex point of the conductive wire 122. A height of a loop of each conductive wires 121, 122 may be decreased. The conductive wire 123 electrically connects the first top surface 11*t*1 of the electronic component 11 to the top surface 102*t* of the most right side pin 101. An apex point of the conductive wire 123 is higher than the apex point of the conductive wire 121. The conductive wire 123 is electrically connected to ground.

The encapsulant 13 encapsulates the lead frame 10 and the electronic component 11. The encapsulant 13 encapsulates the conductive wires 121, 122, 123. The encapsulant 13 is in contact with the first lateral surface 101*s*1 of the pin 101 and spaced apart from the third lateral surface 101*s*3 of the pin 101. A bottom portion of the encapsulant 13 is spaced apart from the pin 101 closest to the electronic component 11. The bottom portion of the encapsulant 13 may include a first lateral surface 13*s*1, a second lateral surface 13*s*2 connected to the first lateral surface 13*s*1, and a first bottom surface 13*b*1 connected to the second lateral surface 13*s*2. The first lateral surface 13*s*1 of the encapsulant 13 may be substantially aligned with the first lateral surface 101*s*1 of the pin 101. The first bottom surface 13*b*1 of the encapsulant 13 may be substantially aligned with the bottom surface 103*b* of the conductive pad 103. The first bottom surface 13*b*1 of the encapsulant 13 may be substantially aligned with the bottom surface 113*b* of the adhesive layer 113.

The third lateral surface 101*s*3 of the pin 101 and the first lateral surface 13*s*1 of the encapsulant 13 collectively define a pin recess 105 recessed from the first lateral surface 101*s*1 of the pin 101. The second lateral surface 13*s*2 of the encapsulant 13 defines a molding recess 133 recessed from the first lateral surface 13*s*1 of the encapsulant 13 and the first bottom surface 13*b*1 of the encapsulant 13. The pin recess 105 faces the molding recess 133. The pin recess 105 is in communication with the molding recess 133. A size of the pin recess 105 may be greater than a size of the molding recess 133. Alternatively, a capacity volume of the pin recess 105 may be greater than a capacity volume of the molding recess 133. A highest end of the pin recess 105 may be higher than a highest end of the molding recess 133. In some embodiments, the second lateral surface 13*s*2 of the encapsulant 13 and the molding recess 133 may be omitted, and the first lateral surface **13*s*1 of the encapsulant 13 may be perpendicular to the first bottom surface 13*b*1 of the encapsulant 13**.

The encapsulant 13 may include a protruding portion 134 having a second bottom surface **13*b*2. The protruding portion 134 of the encapsulant 13 protrudes beyond the horizontal imaginary line 104 between two adjacent curve portions 101*a*. The protruding portion 134 of the encapsulant 13 extends beyond the curve portion 101*a* of the pin 101. An elevation of the second bottom surface 13*b*2 of the protruding portion of the encapsulant 13 is higher than an elevation of the first bottom surface 13*b*1 of the encapsulant 13. The elevation of the second bottom surface 13*b*2 of the encapsulant 13 is between the second top surface 11*t*2 of the electronic component 11 and the bottom surface 11*b* of the electronic component 11. A profile of the protruding portion 134 of the encapsulant 13 filled between adjacent pins 101 is conformal to the pins 101. The shape of the second bottom surface 13*b*2 of the protruding portion 134 of the encapsulant 13 is curved. In some embodiments, a thickness of the encapsulant 13 may be defined as a vertical distance between a top surface of the encapsulant 13 and the first bottom surface 13*b*1 of the encapsulant. Such thickness of the encapsulant 13 may define a total thickness of the package structure 1**.

Since the electronic component 11 is disposed between the pins 101 of the lead frame 10 rather than arranged above/on the lead frame 10, a thickness of the encapsulant 13 can be minimized. Accordingly, a size (e.g., the total thickness) of the package structure 1 is minimized.

Figure 1C:
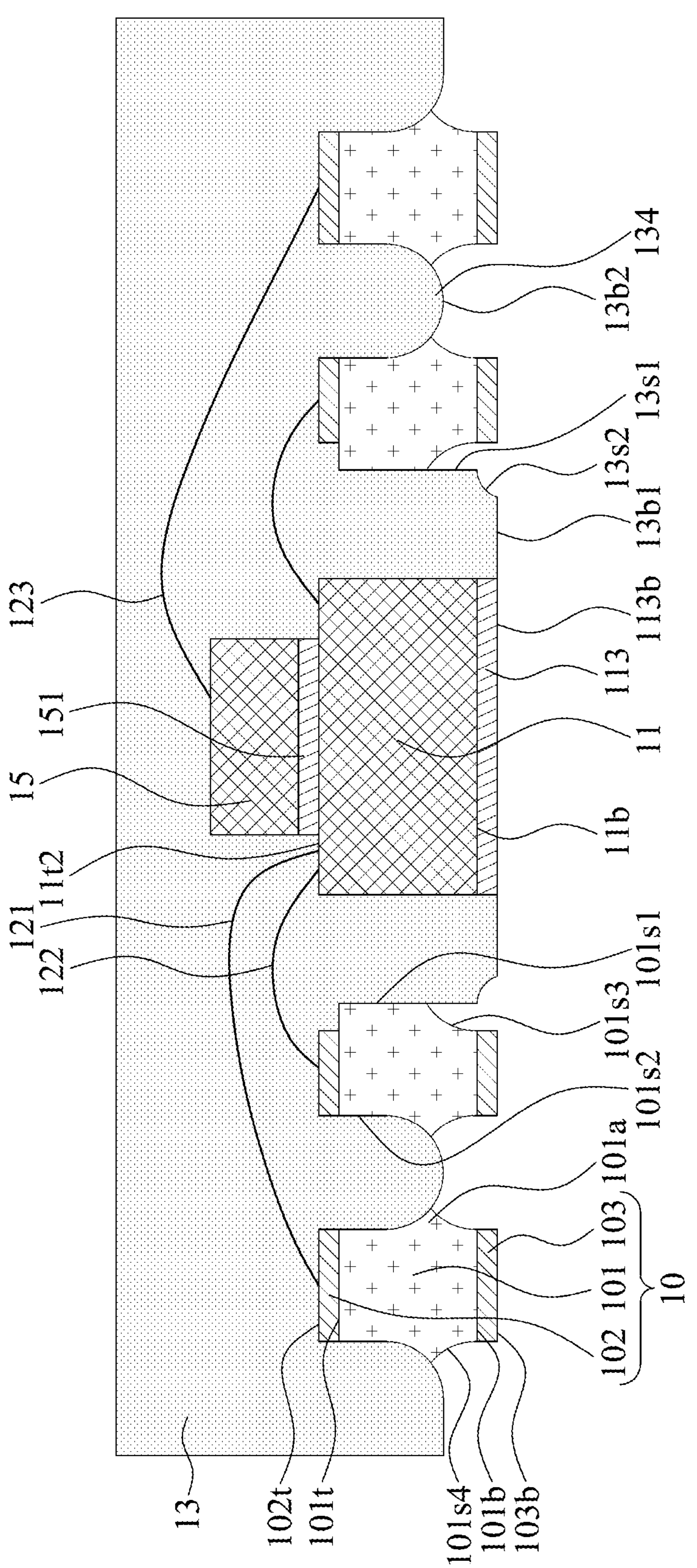
FIG. 1C illustrates a cross-sectional view of a package structure according to some embodiments of the present disclosure.

FIG. 1C is a cross-sectional view of a package structure 1' in accordance with some embodiments of the present disclosure. The package structure 1' is similar to the package structure 1 in FIG. 1B except that an electronic component 15 is disposed above the electronic component 11.

The electronic component 15 is disposed above the electronic component 11 through an adhesive layer 151. A material of the adhesive layer 151 is the same as that of the adhesive layer 131. In some embodiments, the electronic component 15 may include one or more of an application-specific integrated circuit (ASIC), a digital signal processor (DSP), a controller, a processor, or other electronic components or semiconductor devices. The electronic component 15 (e.g., an ASIC device) may be used, for example, to collect the information obtained by the electronic component 11 (e.g., a MEMS device), and transmit or process the information in an analog or digital form.

Figure 1D:
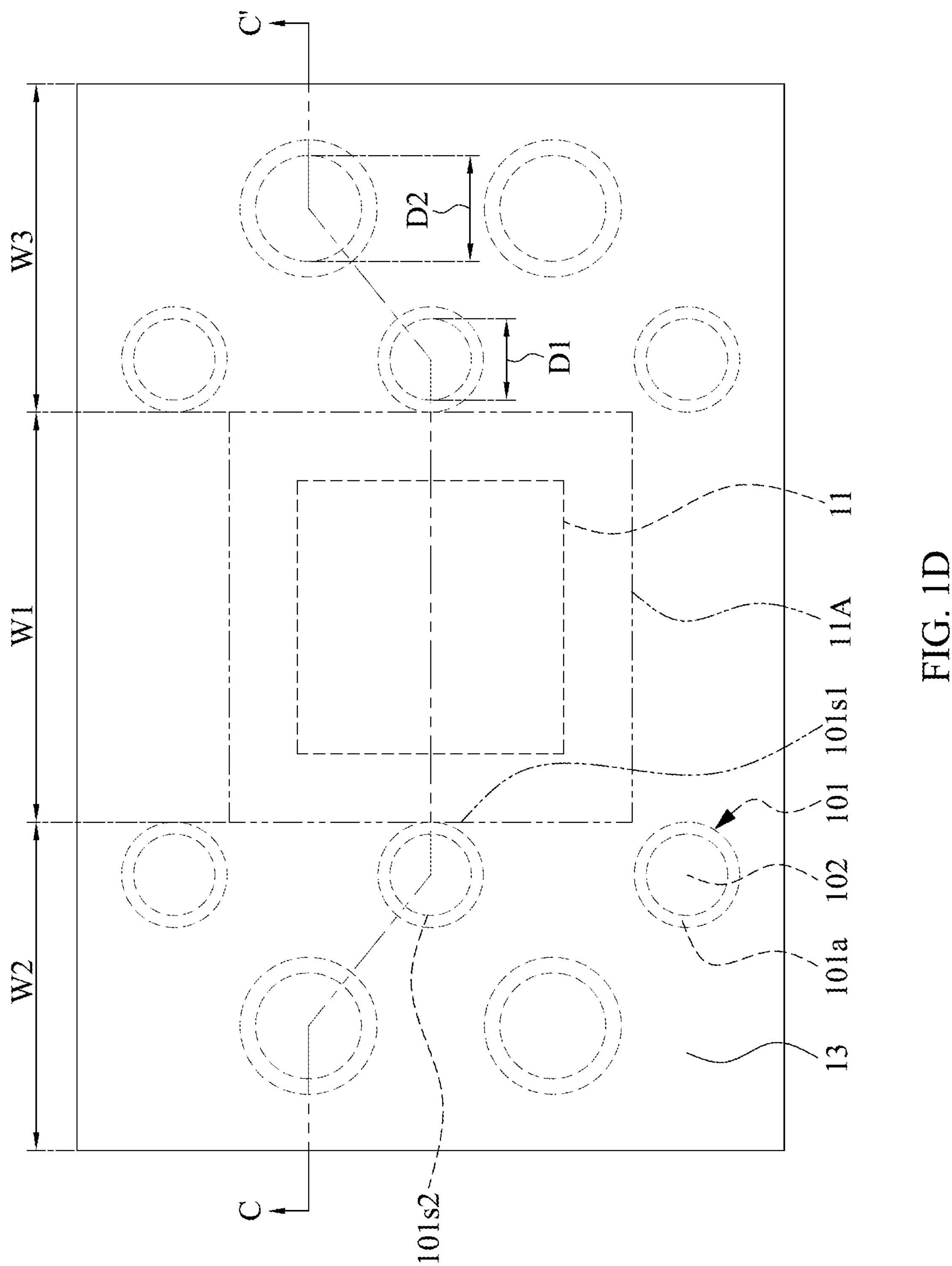
FIG. 1D illustrates a top view of a package structure according to some embodiments of the present disclosure.
Figure 1E:
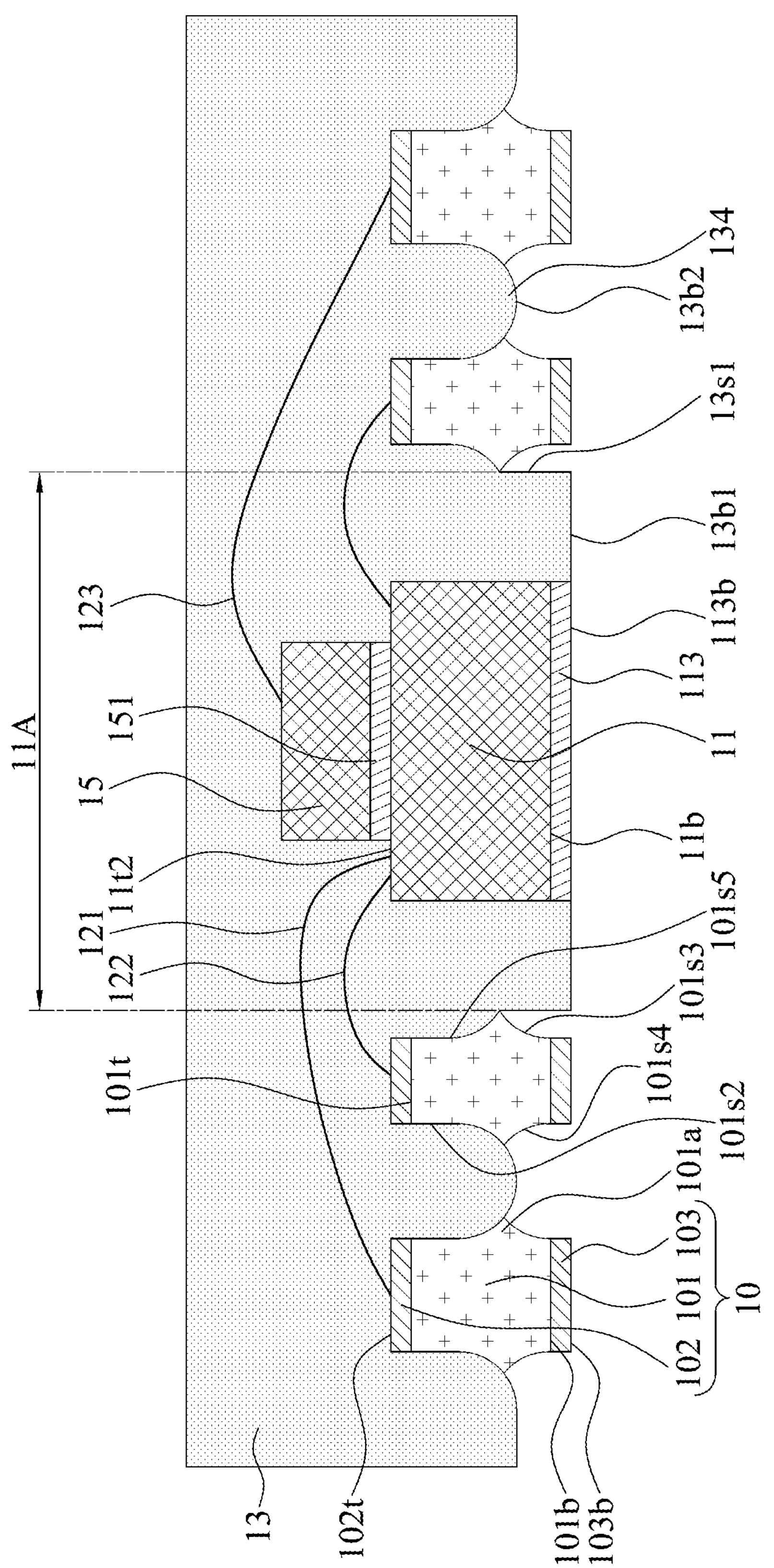
FIG. 1E illustrates a cross-sectional view of the package structure taken along line C-C' of FIG. 1D.

FIG. 1D is a top view of a package structure 1" in accordance with some embodiments of the present disclosure. FIG. 1E is a cross-sectional view of the package structure 1" taken along line C-C' of FIG. 1D. The package structure 1" is similar to the package structure 1 in FIG. 1A and FIG. 1B, except that the pin 101 closest to the left side/right side of the electronic component 11 includes a curve portion **101*a*. The pin 101 closest to the left side/right side of the electronic component 11 has a top surface 101*t*, a bottom surface 101*b* opposite to the top surface 101*t*, a first lateral surface 101*s*5 connected to the top surface 101*t*, a second lateral surface 101*s*2 connected to the top surface 101*t*, a third lateral surface 101*s*3 connected to the first lateral surface 101*s*5, and a fourth lateral surface 101*s*4 opposite to the third lateral surface 101*s*3 and connected to the second lateral surface 101*s*2. The first lateral surface 101*s*5, the second lateral surface 101*s*2, the third lateral surface 101*s*3, and the fourth lateral surface 101*s*4 of the pin 101 may be curved. A lower portion of the first lateral surface 101*s*5 and an upper portion of the third lateral surface 101*s*3 may collectly define the curve portion 101*a*. In addition, and the first lateral surface 13*s*1 of the encapsulant 13 may be perpendicular to and connected to the first bottom surface 13*b*1 of the encapsulant 13**.

Figure 1F:
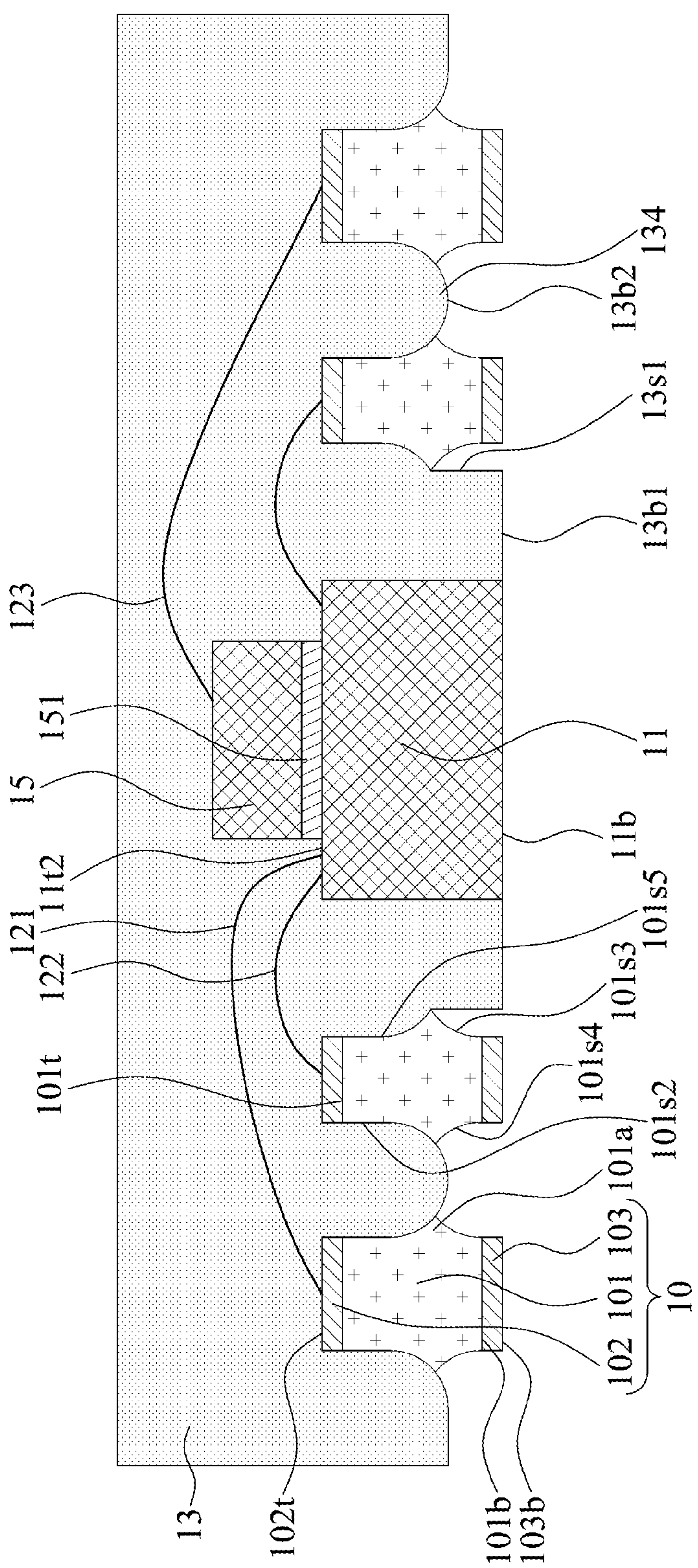
FIG. 1F illustrates a cross-sectional view of a package structure according to some embodiments of the present disclosure.

FIG. 1F is a cross-sectional view of a package structure 1''' according to some embodiments of the present disclosure. The package structure 1''' of FIG. 1F is similar to the package structure 1" of FIG. 1E, except that the adhesive layer 113 of FIG. E is omitted and the bottom surface **103*b* of the conductive pad 103, the bottom surface 11*b* of the electronic component 11 and the first bottom surface 13*b*1 of the encapsulant 13** are substantially aligned with each other.

Figure 2A:
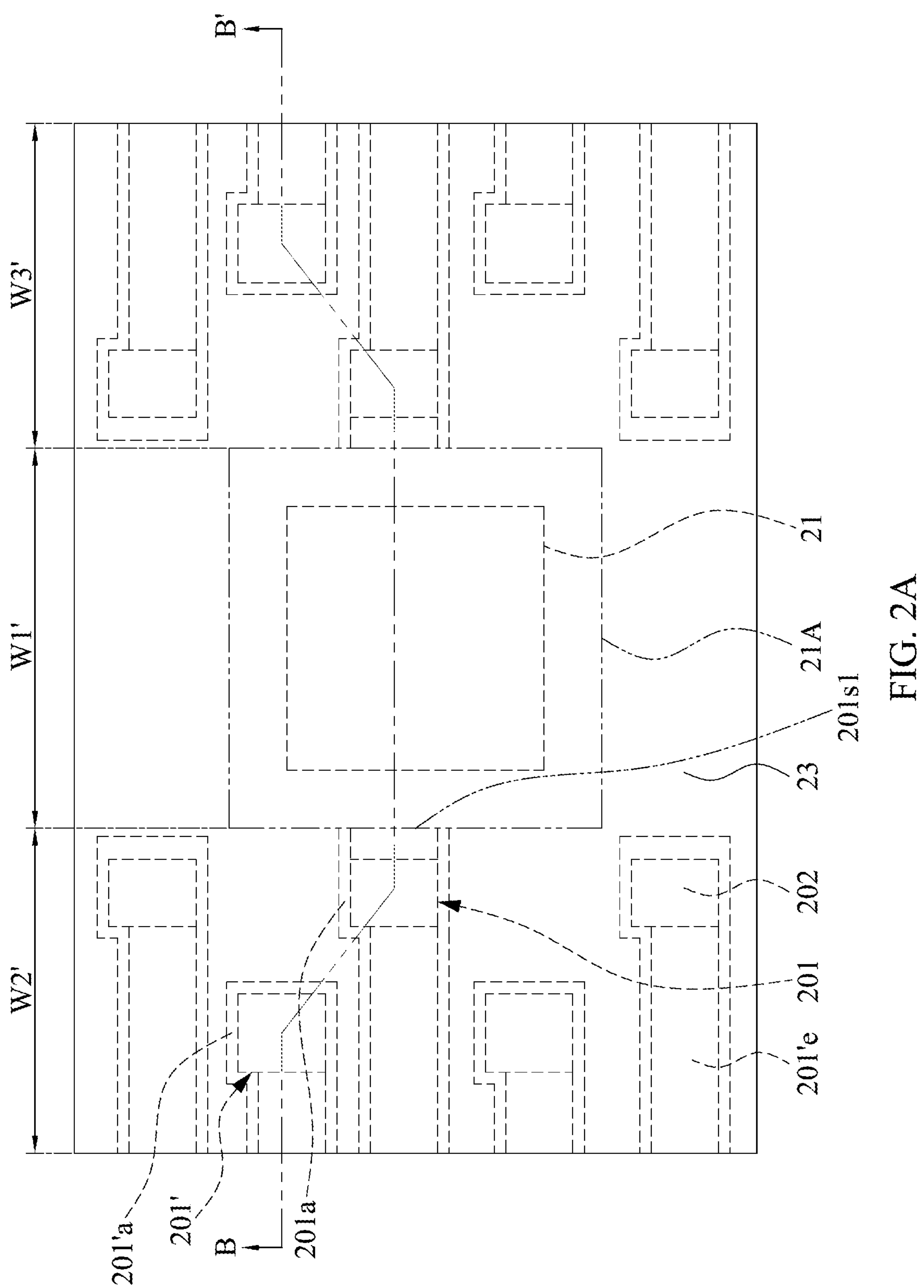
FIG. 2A illustrates a top view of a package structure according to some embodiments of the present disclosure.
Figure 2B:
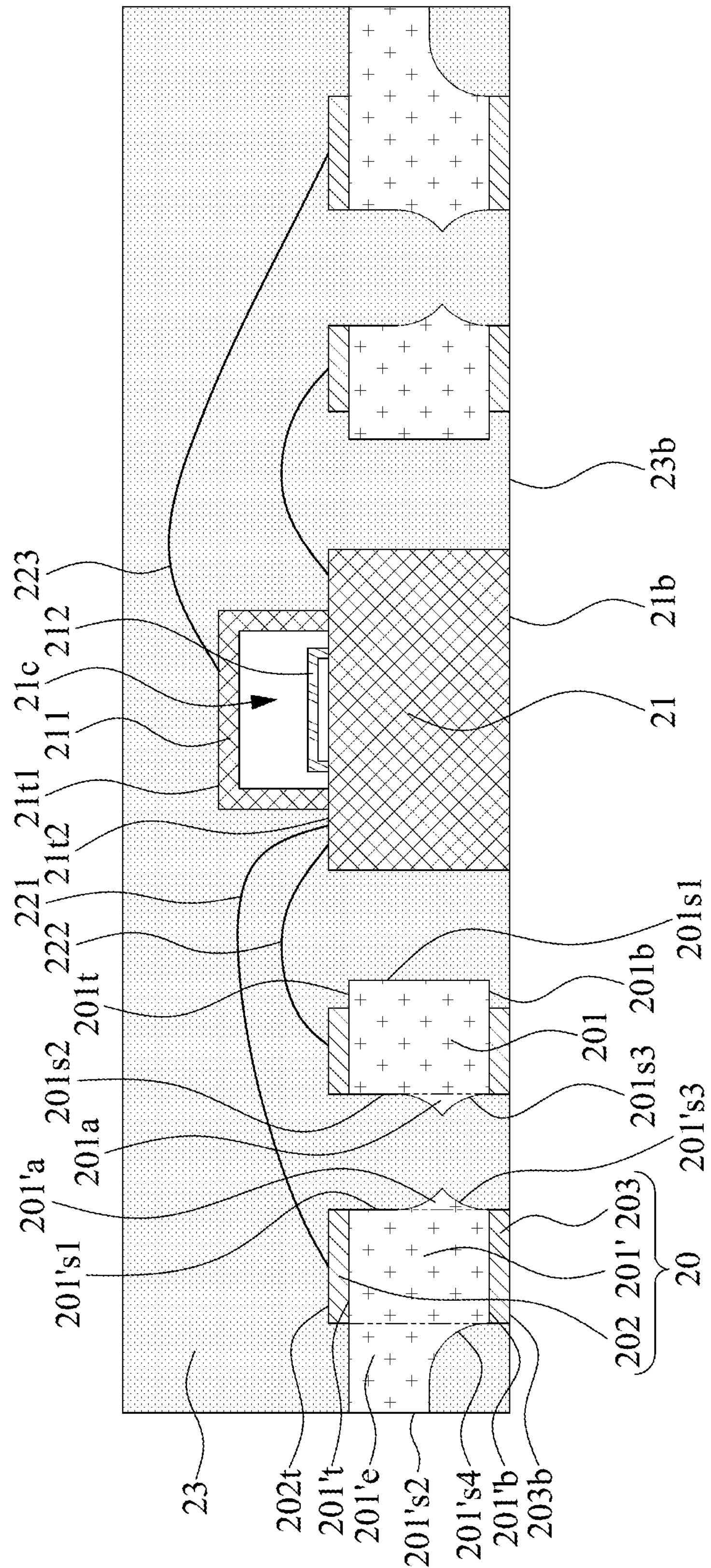
FIG. 2B illustrates a cross-sectional view of a package structure taken along line B-B' of FIG. 2A.

FIG. 2A is a top view of a semiconductor device package 2 according to some embodiments of the present disclosure. FIG. 2B is a cross-sectional view of the package structure 2 taken along line B-B' of FIG. 2A. The package structure 2 may be an electronic device, a semiconductor device package or a semiconductor package device.

The package structure 2 includes a lead frame 20, an electronic component 21, a plurality of conductive wires 221, 222, 223, and an encapsulant 23. The configurations of the conductive wires 221, 222, 223 are similar to those of the conductive wires 121, 122, 123 of FIG. 1B. The encapsulant 23 covers a plurality of conductive pads 202 of the lead frame 20, a plurality of curve portions **201*a* of the lead frame 20, and a plurality of extension portions 201'*e* of the lead frame 20**.

The structure of the lead frame 20 is similar to the structure of the lead frame 10. The lead frame 20 includes at least one pin 201, at least one pin 201', at least one conductive pad 202, and at least one conductive pad 203. The pin 201 is closest to the left side/right side of the electronic component 21. The pin 201' is adjacent to a periphery of the lead frame 20.

The conductive pad 202 is disposed on a top surface **201*t* of the pin 201. The conductive pad 202 has a top surface 202*t*. The top surface 202*t* of the conductive pad 202 and the second top surface 21*t*2 of the electronic component 21 are substantially coplanar with each other or aligned with each other. The conductive pad 203 is disposed on a bottom surface 201*b* of the pin 201. The conductive pad 203 has a bottom surface 203*b*. The bottom surface 203*b* of the conductive pad 203 and the bottom surface 21*b* of the electronic component 21** are substantially coplanar with each other or aligned with each other.

The pin 201 includes a curve portion **201*a*. The pin 201 has the top surface 201*t*, the bottom surface 201*b* opposite to the top surface 201*t*, a first lateral surface 201*s*1 extending between the top surface 201*t* and the bottom surface 201*b*, a second lateral surface 201*s*2 opposite to the first lateral surface 201*s*1, and a third lateral surface 201*s*3 opposite to the first lateral surface 201*s*1 and extending from the second lateral surface 201*s*2. The first lateral surface 201*s*1 of the pin 201 is a vertical surface. The second lateral surface 201*s*2 and the third lateral surface 201*s*3 are curved. The pin 201 has a curve portion 201*a* facing away the electronic component 21. The conductive pad 202 partially covers the top surface 201*t* of the pin 201. The conductive pad 203 partially covers the bottom surface 201*b* of the pin 201**.

The first lateral surface **201*s*1 faces the electronic component 21. A surface roughness (Ra) of the first lateral surface 201*s*1 of the pin 201 is greater than a roughness of the second lateral surface 201*s*2 of the pin 201. The surface roughness of the first lateral surface 201*s*1 of the pin 201 is greater than a roughness of the third lateral surface 201*s*3 of the pin 201**.

Similarly, the pin 201' includes a curve portion 201'*a*. The pin 201' includes an extension portion 201'*e* extending to a periphery of the encapsulant 23 or a lateral surface of the package structure 2. A position of the extension portion 201'*e* is relatively higher than that of the curve portion 201'*a*. The pin 201' has a top surface 201'*t*, a bottom surface 201'*b* opposite to the top surface 201'*t*, a first lateral surface 201'*s*1 connected to the top surface 201'*t*, a second lateral surface 201'*s*2 opposite to the first lateral surface 201'*s*1, a third lateral surface 201'*s*3 connected to the first lateral surface 201'*s*1, and a fourth lateral surface 201'*s*4 connected to the second lateral surface 201'*s*2. The second lateral surface 201'*s*2 of the pin 201 (or the extension portion 201'*e*) is a vertical surface and may be aligned with a lateral surface of the encapsulant 23. The first lateral surface 201'*s*1, the third lateral surface 201'*s*3, and the fourth lateral surface 201'*s*4 are curved. The pin 201' has a curve portion 201'*a* facing the electronic component 21.

The package structure 2 has a die attach region 21A (or a die security region). The die attach region 21A may be arranged at a central portion of the package structure 2, and the pin(s) 201, 201' may be disposed around the die attach region 21A. The die attach region 21A has a width W1'. In some embodiments, the width W1' may be equal to a distance between two first lateral surfaces 201*s*1 of the pins 201. A distance W2' is defined as a distance between the left side of the die attach region 21A and the left side of the package structure 2. A distance W3' is defined as a distance between the right side of the die attach region 21A and the right side of the package structure 2. The width W1' may be greater than the distance W2'. The width W1' may be greater than the distance W3'. The distance W2' may be equal to or different from the distance W3'.

The electronic component 21 includes a cap 211 and a membrane 212. The cap 211 has a first top surface 21*t*1 and defines a cavity 21*c*. The electronic component 21 has a second top surface 21*t*2 and a bottom surface 21*b* opposite to the second top surface 21*t*2. The configurations of the electronic component 21 are similar to those of the electronic component 11 of FIG. 1B, except that there is no adhesive layer under the electronic component 21.

The encapsulant 23 completely encapsulates the lead frame 20, the electronic component 21 and the conductive wires 221, 222, 223. The encapsulant 23 completely encapsulates the pins 201, 201'. The encapsulant 23 encapsulates the first lateral surface 201*s*1, the second lateral surface 201*s*2, and the third lateral surface 201*s*3 of the pin 201. The encapsulant 23 encapsulates the exposed top surface 201*t* and the exposed bottom surface 201*b* of the pin 201. The encapsulant 23 encapsulates the first lateral surface 201'*s*1, the third lateral surface 201'*s*3, and the fourth lateral surface 201'*s*4 of the pin 201'. The encapsulant 23 encapsulates the exposed top surface 201'*t* of the pin 201'.

Since the electronic component 21 is disposed between the pins 201 of the lead frame 20 rather than arranged above/on the lead frame 20, a thickness of the encapsulant 23 can be minimized. Accordingly, a size (e.g., the total thickness) of the package structure 2 is minimized.

Figure 2C:
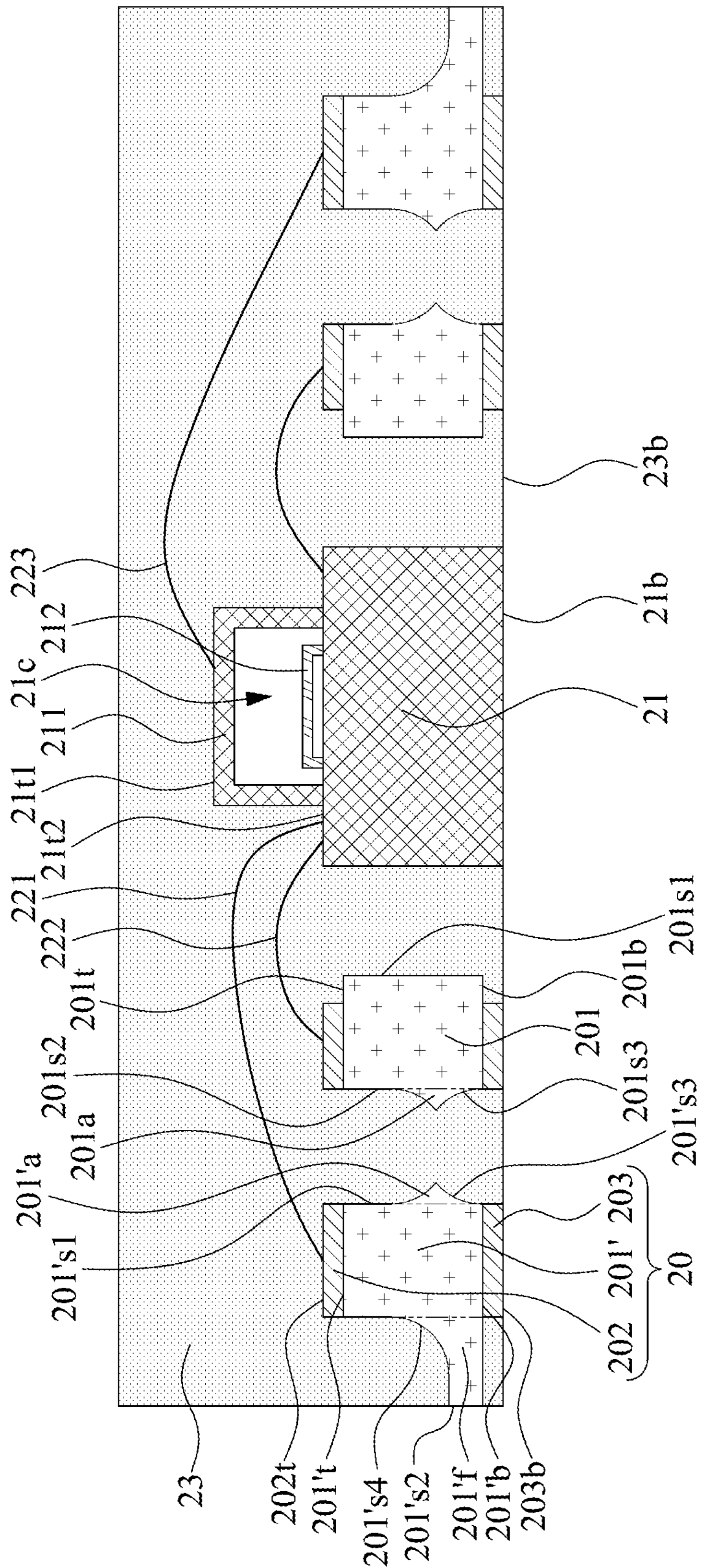
FIG. 2C illustrates a cross-sectional view of a package structure according to some embodiments of the present disclosure.

FIG. 2C is a cross-sectional view of a package structure 2' in accordance with some embodiments of the present disclosure. The package structure 2' is similar to the package structure 2 in FIG. 2B except that a position of an extension portion 201'*f* of the pin 201' is relatively lower than that of a curve portion 201'*a* of the pin 201'.

Figure 2D:
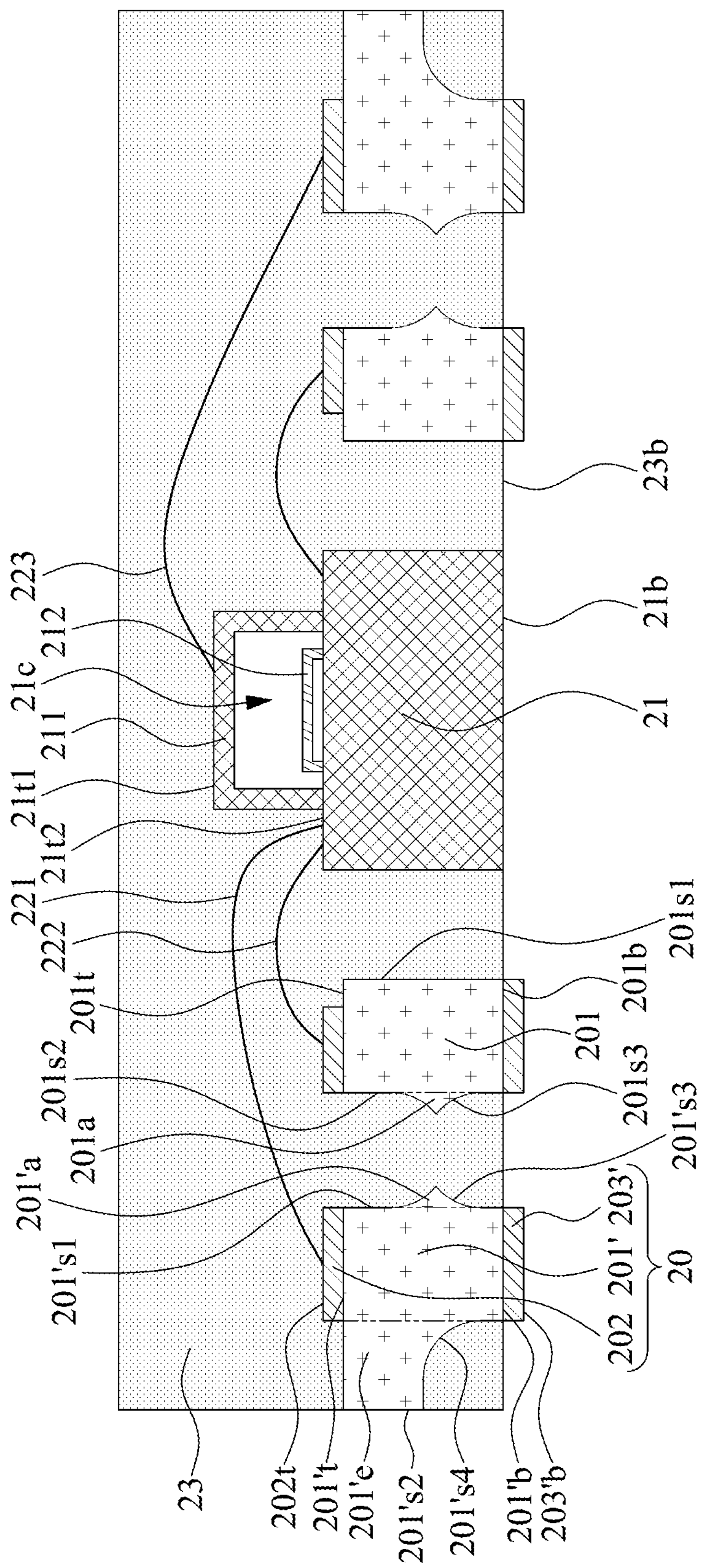
FIG. 2D illustrates a cross-sectional view of a package structure according to some embodiments of the present disclosure.

FIG. 2D is a cross-sectional view of a package structure 2" in accordance with some embodiments of the present disclosure. The package structure 2" is similar to the package structure 2 in FIG. 2B except that a conductive pad 203' is exposed rather than encapsulated by the encapsulant 23.

Accordingly, the bottom surface 21*b* of the electronic component 21, the bottom surface 201*b* of the pin 201, the bottom surface 201'*b* of the pin 201', and the bottom surface 23*b* of the encapsulant 23 are substantially coplanar with each other or aligned with other. A bottom surface 203'*b* of the conductive pad 203' is lower than the bottom surface 23*b* of the encapsulant 23.

In some embodiments, the conductive pad 203' may include a solder material, such as tin (Sn). The conductive pad 203' may facilitate following soldering operations for connecting the package structure 2" to other elements, such as a main board.

Figure 2E:
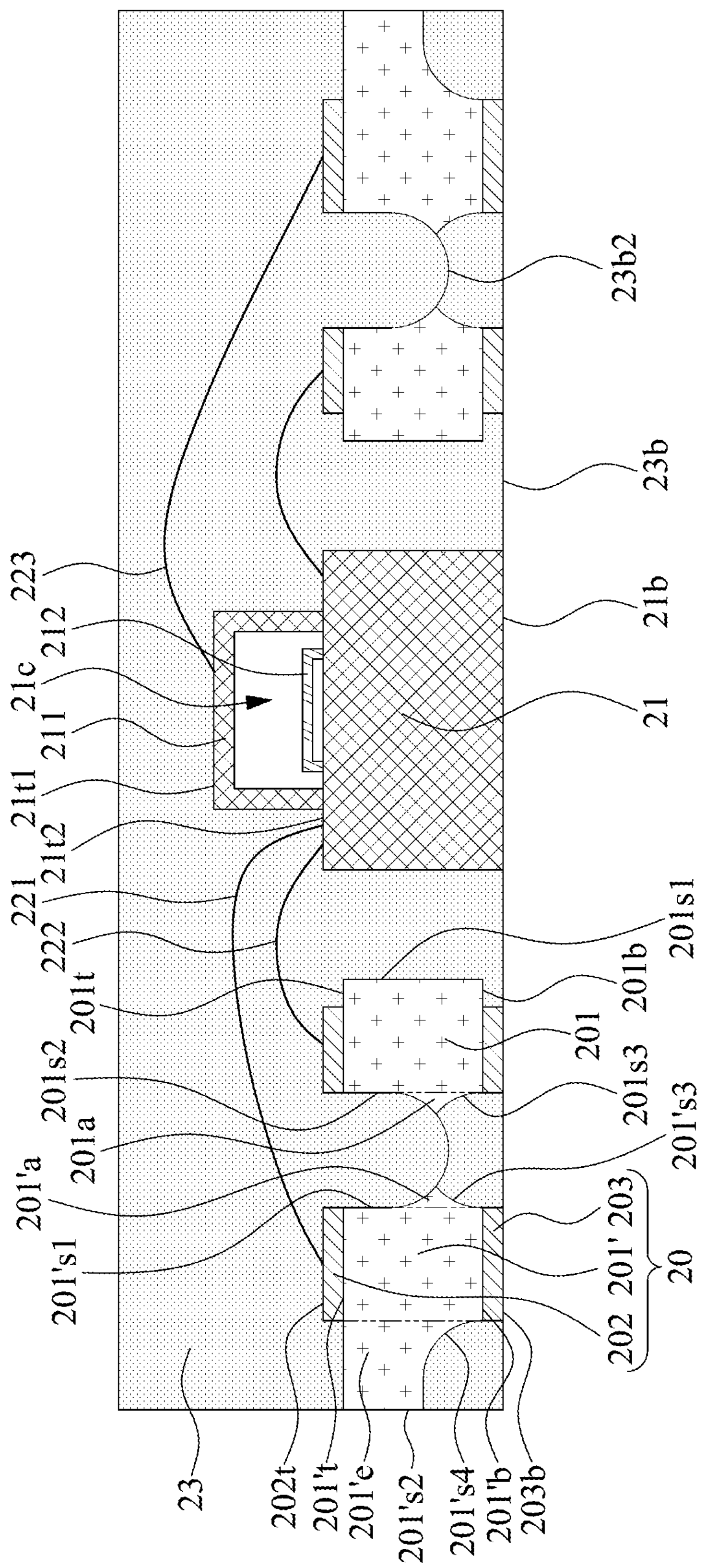
FIG. 2E illustrates a cross-sectional view of a package structure according to some embodiments of the present disclosure.

FIG. 2E is a cross-sectional view of a package structure 2'" in accordance with some embodiments of the present disclosure. The package structure 2' is similar to the package structure 2" in FIG. 2D except that there is an encapsulant boundary 23*b*2 connected between the curve portion 201'*a* of the pin 201' and the curve portions 201*a* of the pin 201.

FIGS. 3A through 3H illustrate some embodiments of a method of manufacturing the package structure 1 of FIG. 1B according to some embodiments of the present disclosure.

Figure 3A:
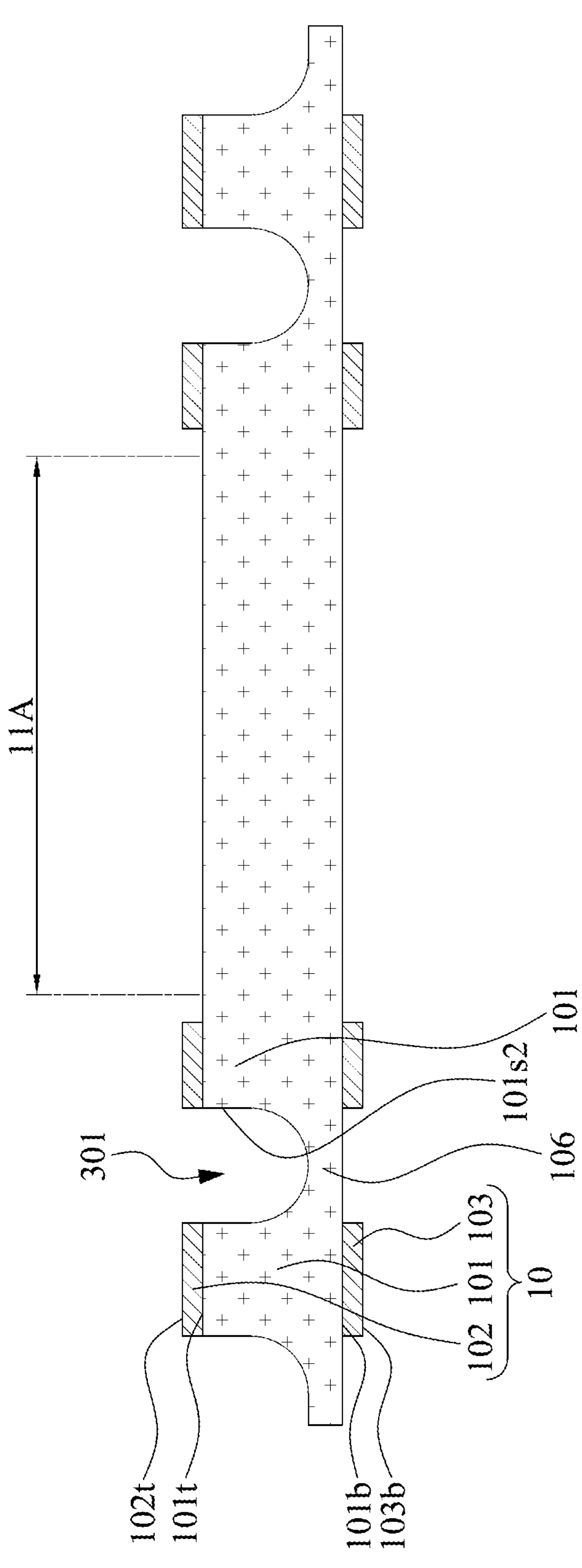
FIG. 3A illustrates a method of manufacturing a package structure according to some embodiments of the present disclosure.
Figure 3B:
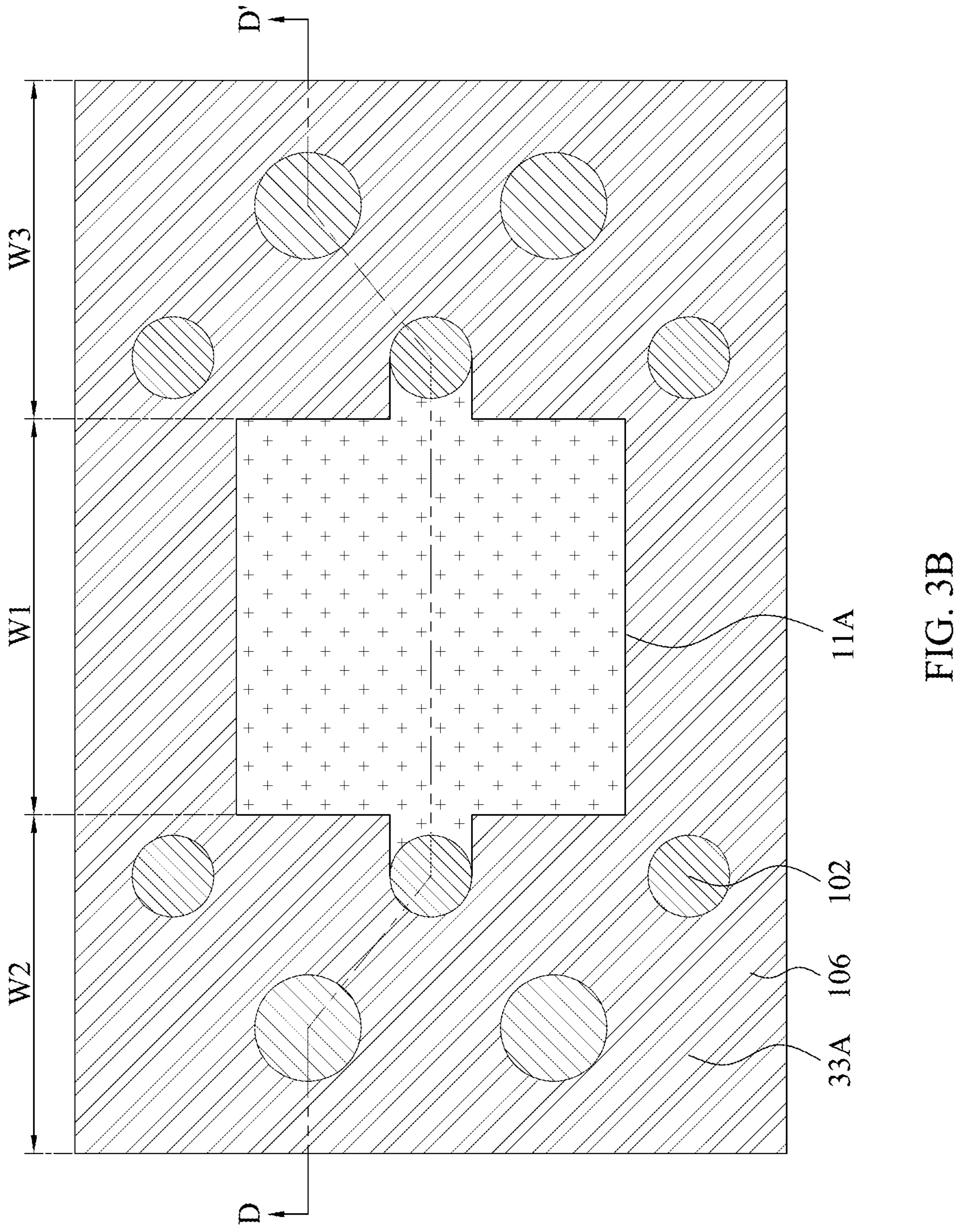
FIG. 3B illustrates a method of manufacturing a package structure according to some embodiments of the present disclosure.

Referring to FIG. 3A and FIG. 3B, wherein FIG. 3A shows a cross-sectional view of a structure taken along line D-D' of FIG. 3B, a lead frame 10 is provided. The lead frame 10 includes a base material 106, at least one pin 101, at least one conductive pad 102, and at least one conductive pad 103 and a die attach region 11A (or a die security region). The pin 101 protrudes from the base material 106. The pin 101 has a lateral surface 101*s*2. The patterned conductive pad 102 is formed or disposed on a top surface 101*t* of the pin 101. The patterned conductive pad 102 has a top surface 102*t*. The patterned conductive pad 103 is formed or disposed on a bottom surface 101*b* of the lead frame 10. The patterned conductive pad 103 has a bottom surface 103*b*. The patterned conductive pad 103 may be used for the following soldering operation. In some embodiments, the patterned conductive pads 102, 103 may include copper (Cu), a copper (Cu) alloy or other suitable materials.

The die attach region 11A (or a die security region) is located at a central portion of the lead frame 10 or a portion adjacent to the central portion of the lead frame 10. The die attach region may be predetermined or predefined. The lead frame 10 has an etching region 33A. The predefined die attach region and the region extending between the patterned conductive pad 102 and the die attach region are unetched. An elevation of a top surface of the die attach region is higher than an elevation of the etching region 33A. The die attach region is large enough to facilitate die-attaching process during the following operation. In some embodiments, the die attach region may be square or rectangular.

The lead frame 10 defines an empty space 301 formed by an etching operation. The space 301 extends through the lead frame 10. That is, a portion of an upper portion of the lead frame 10 is etched, and the base material 106, the pin 101 and the die attach region 11A remain. The etching region 33A and the space 301 are both formed by etching operations.

Figure 3C:
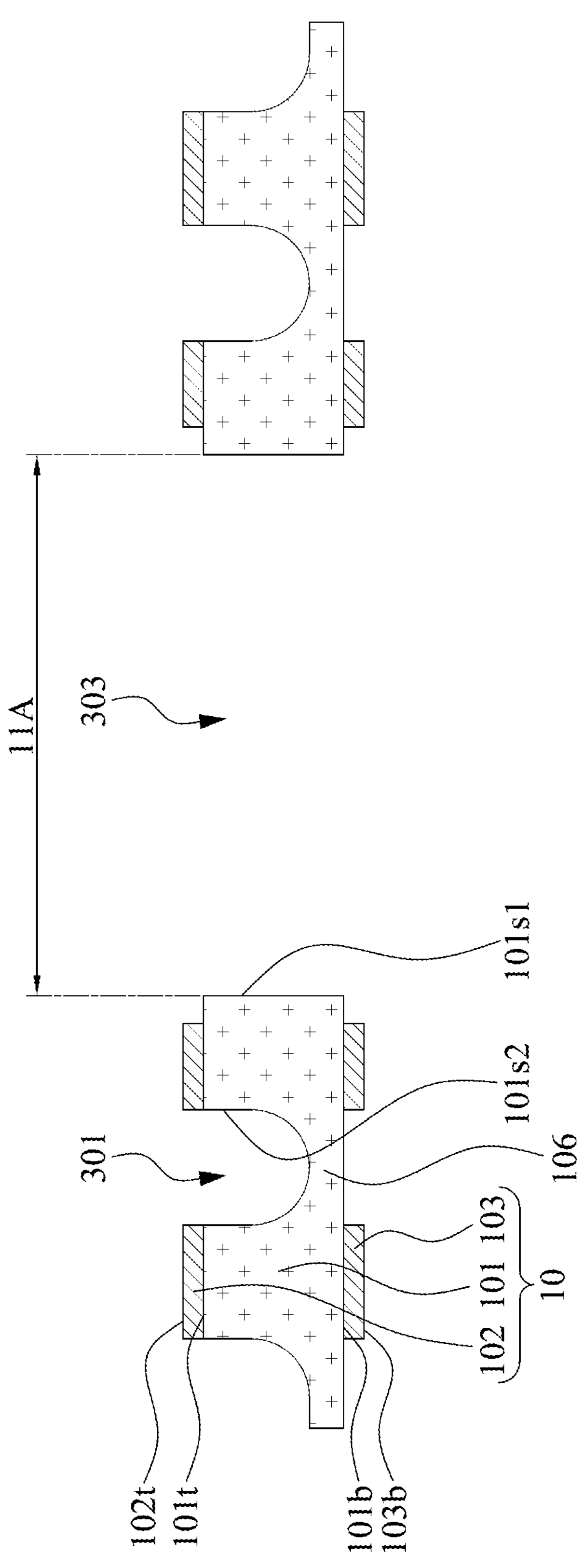
FIG. 3C illustrates a method of manufacturing a package structure according to some embodiments of the present disclosure.

Referring to FIG. 3C, an accommodation space 303 is formed by a punch operation. The accommodation space 303 extends through the lead frame 10 for accommodating an electronic component 11 (FIG. 3E). A position of the accommodation space 303 may correspond to the die attach region 11A of FIG. 3A and FIG. 3B. A central portion of the lead frame 10 (corresponding to the die attach region 11A) is removed by the punch operation one time for saving costs.

The lead frame 10 has a lateral surface **101*s*1 after the punch operation. That is, the lateral surface 101*s*1 is formed due to the punch operation. Thus, the accommodation space 303 is defined by the lateral surface 101*s*1 of the lead frame 10. A surface roughness of the lateral surface 101*s*1 of the lead frame 10 is greater than a surface roughness of the lateral surface 101*s*2 of the pin 10 of the lead frame 10** due to a process difference between the punch operation and the etching operation.

The lead frame 10 has a first portion corresponding to a distance W2 as shown in FIG. 3B and a second portion corresponding to a distance W3 as shown in FIG. 3B after the punching operation. A width of the space 303 is greater than a width of the first portion of the lead frame 10.

Figure 3D:
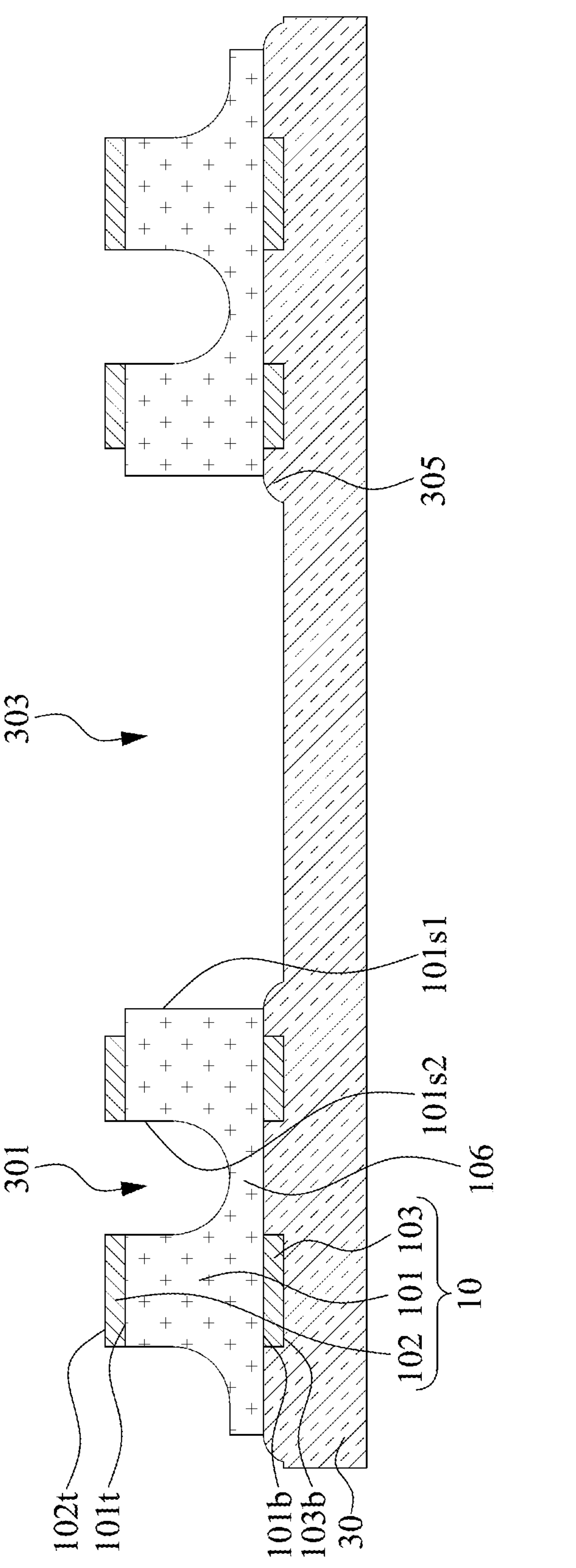
FIG. 3D illustrates a method of manufacturing a package structure according to some embodiments of the present disclosure.
Figure 3E:
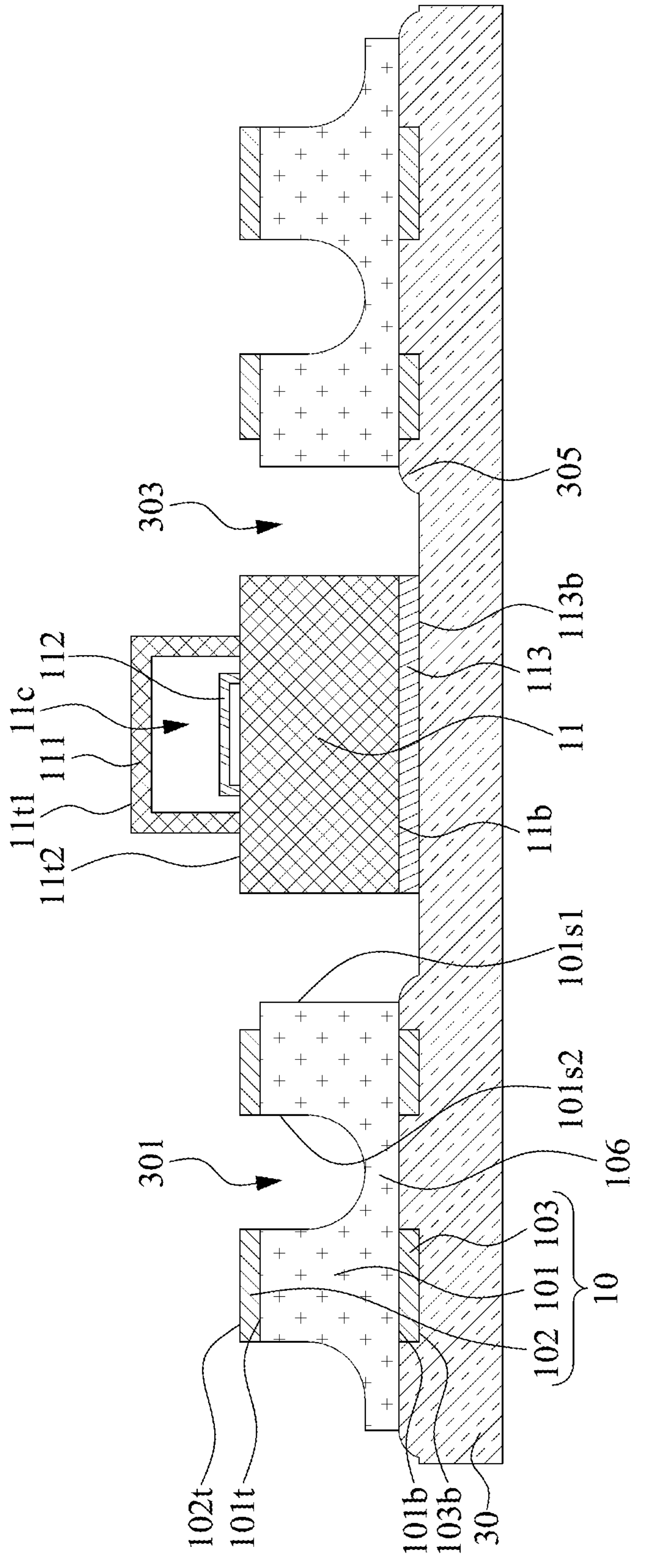
FIG. 3E illustrates a method of manufacturing a package structure according to some embodiments of the present disclosure.

Referring to FIG. 3D, the lead frame 10 is disposed on a temporary carrier 30. In some embodiments, the temporary carrier 30 may be a tape. The conductive pads 103 of the lead frame 10 are pressed into the temporary carrier 30. An adhesive of the temporary carrier completely covers the conductive pads 103. The adhesive of the temporary carrier 30 may be in contact with the bottom surface **101*b* of the lead frame 10. A portion of the adhesive may be a protruding portion 305. The protruding portion 305 of the temporary carrier 30 protrudes into a vertical projection of the accommodation space 303. That is, the protruding portion 305 of the temporary carrier 30 may be located between two opposite lateral surface 101*s*1 of the lead frame 10**.

Referring to FIG. 3E, an electronic component 11 is disposed on the temporary carrier 30 in the accommodation space 303. In some embodiments, an adhesive layer 113 is applied on a bottom surface **11*b* of the electronic component 11. Thus, the electronic component 11 is attached to the temporary carrier 30 through the adhesive layer 113. A bottom surface 113*b* of the adhesive layer 113 and the bottom surface 103*b* of the conductive pad 103 are substantially coplanar with each other or aligned with each other. The electronic component 11 has a cap 111 and a membrane 112. The cap 111 defines a cavity 11*c* to accommodate the membrane 112. The electronic component 11 includes a first top surface 11*t*1, a second top surface 11*t*2, and a bottom surface 11*b* opposite to the second top surface 11*t*2, wherein the second top surface 11*t*2 is between the first top surface 11*t*1 and the bottom surface 11*b*. The second top surface 11*t*2 of the electronic component 11 and the top surface 102*t* of the conductive pad 102 are substantially coplanar with each other or aligned with each other. In some embodiments, the electronic component 11** may include, e.g., a MEMS package, a MEMS microphone, or a MEMS gas sensor.

Figure 3F:
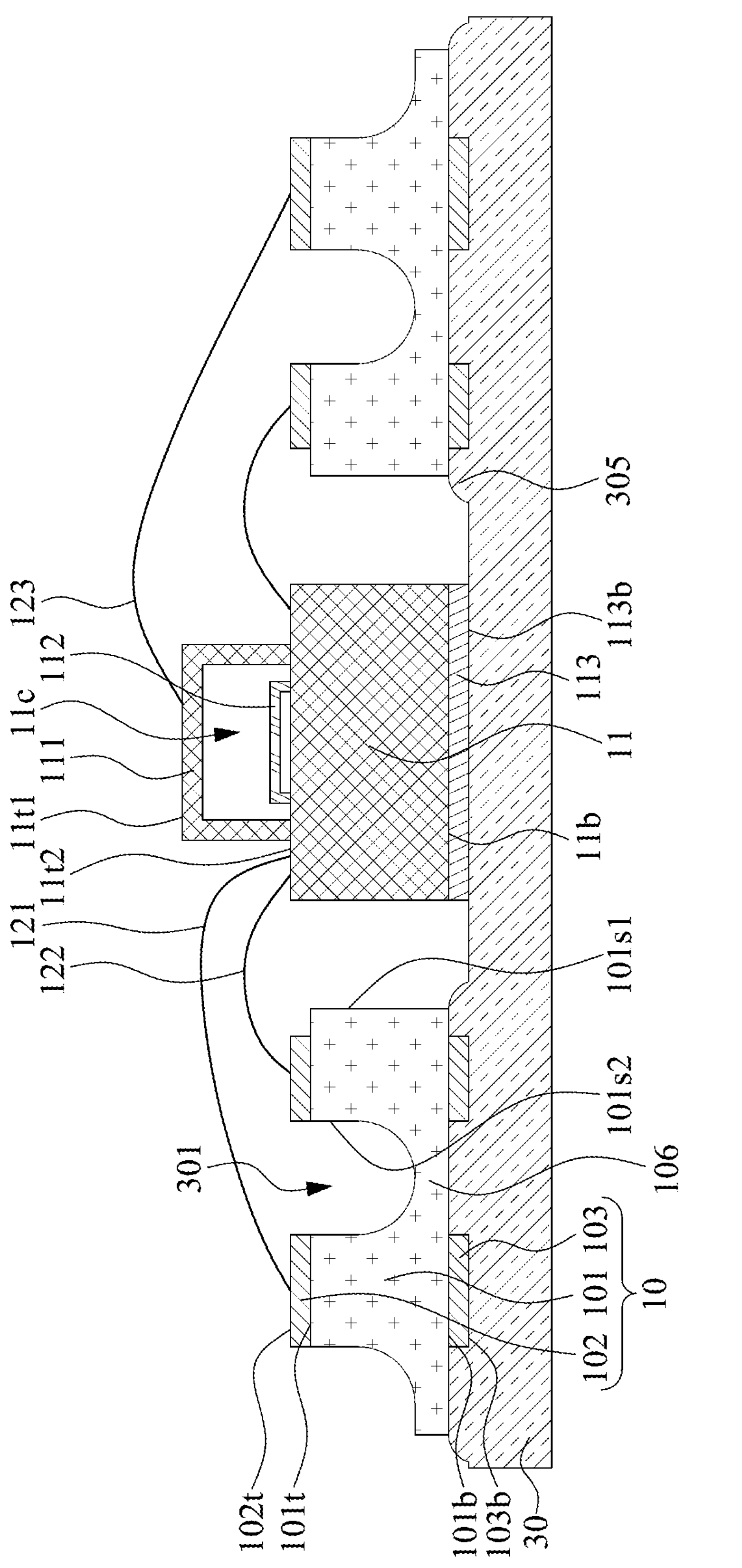
FIG. 3F illustrates a method of manufacturing a package structure according to some embodiments of the present disclosure.

Referring to FIG. 3F, conductive wires 121, 122, 123 are formed or provided to electrically connect the electronic component 11 to the lead frame 10. An elevation of a first end of the conductive wire 121 at the top surface **102*t* of the conductive pad 102 is substantially equal to an elevation of a second end of the conductive wire 121 at the second top surface 11*t*2 of the electronic component 11. An elevation of a first end of the conductive wire 122 at the top surface 102*t* of the conductive pad 102 is substantially equal to an elevation of a second end of the conductive wire 122 at the second top surface 11*t*2 of the electronic component 11. A height of a loop of each conductive wires 121, 122** may be decreased.

The conductive wires 121, 122, 123 may be provided by a reverse bonding operation. For example, the first end of the conductive wire 121 may be first provided at the top surface **102*t* of the conductive pad 102, and then the second end of the conductive wire 121 is provided to the second top surface 11*t*2 of the electronic component 11. That is, the first end of the conductive wire 121 is a first bond, and the second end of the conductive wire 121 is a second bond. Apex points of the conductive wires 121, 122, 123** may be as low as possible by using the reverse bonding operation.

In some embodiments, a forward bonding operation may be performed based on needs. For example, a first end of the conductive wire 123 may be first provided at the first top surface **11*t*1 of the electronic component 11, and then a second end of the conductive wire 123 is provided to the top surface 102*t* of the conductive pad 102**.

Figure 3G:
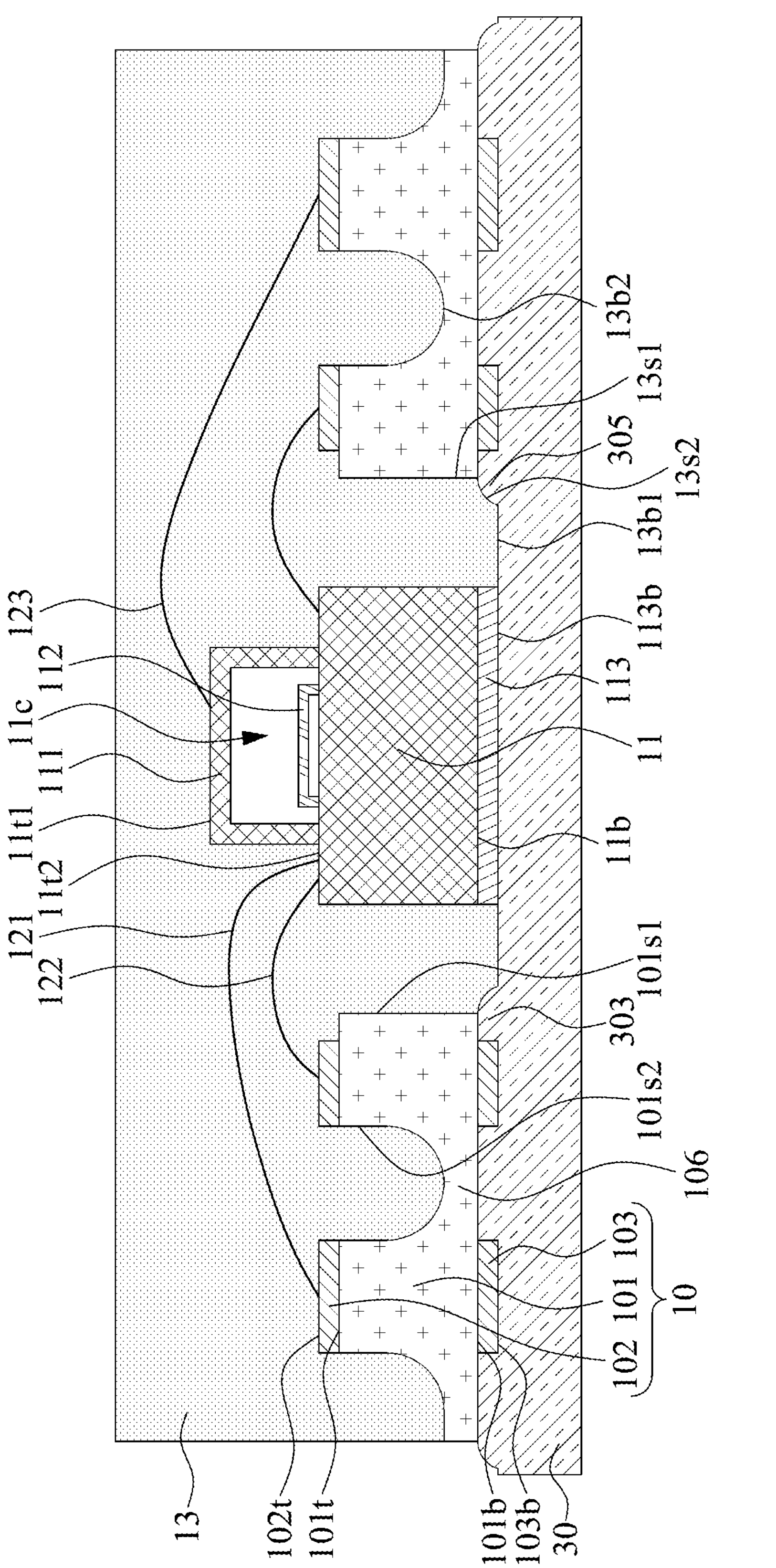
FIG. 3G illustrates a method of manufacturing a package structure according to some embodiments of the present disclosure.

Referring to FIG. 3G, an encapsulant 13 is provided by a molding operation. The encapsulant 13 encapsulates the lead frame 10, the electronic component 11, and the conductive wires 121, 122, 123. The encapsulant 13 has a bottom surface **13*b*1, a first lateral surface 13*s*1, and a second lateral surface 13*s*2. The first lateral surface 13*s*1 of the encapsulant 13 is vertical and the second lateral surface 13*s*2 of the encapsulant 13 is curved. The first lateral surface 13*s*1 of the encapsulant 13 contacts the lateral surface 101*s*1 of the lead frame 10. The second lateral surface 13*s*2 of the encapsulant 13 is conformal to the protruding portion 305 of the temporary carrier 30. The bottom surface 13*b*1 of the encapsulant 13 and the bottom surface 113*b* of the adhesive layer 113** are substantially coplanar with each other or aligned with each other.

Figure 3H:
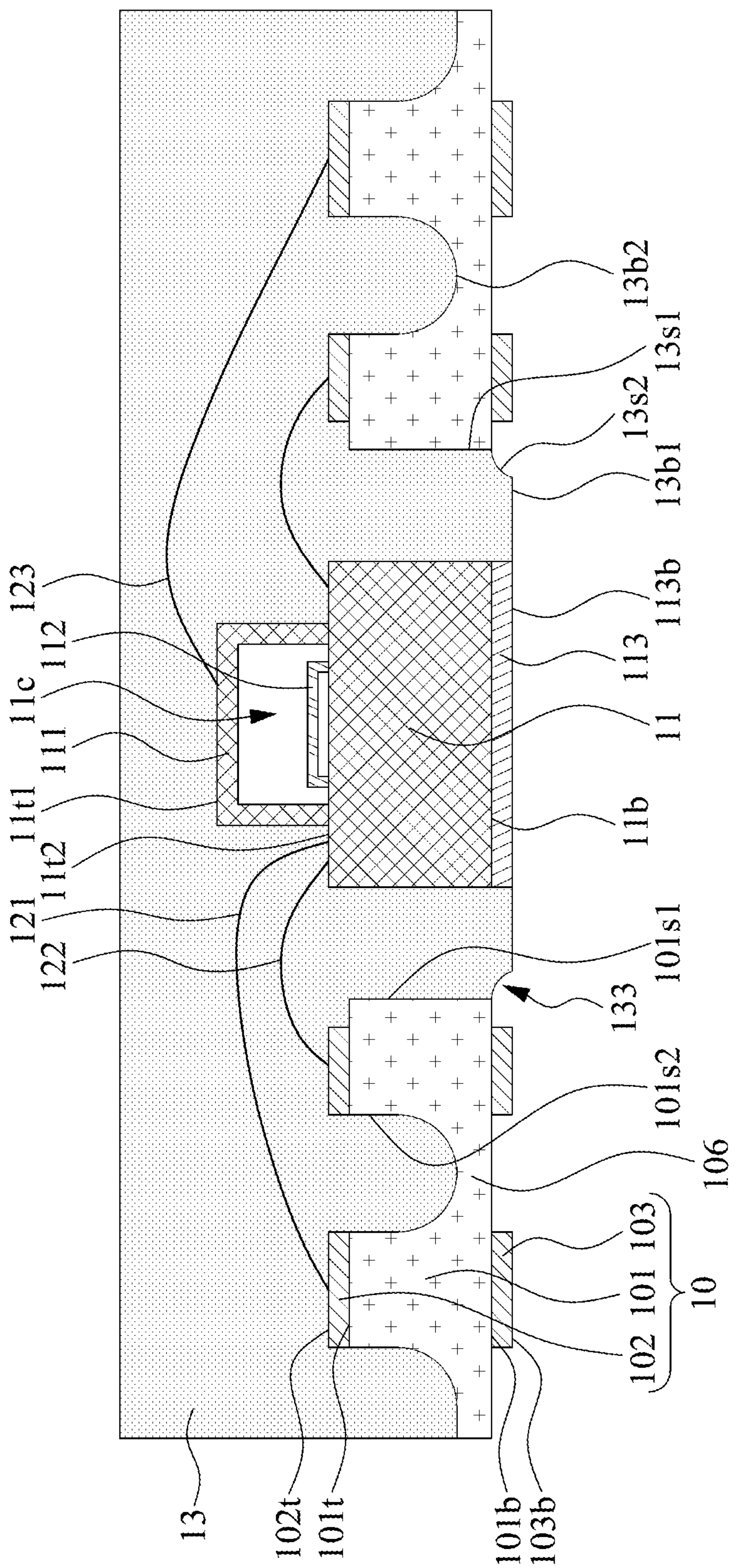
FIG. 3H illustrates a method of manufacturing a package structure according to some embodiments of the present disclosure.

Referring to FIG. 3H, the temporary carrier 30 is removed. The second lateral surface **13*s*2 of the encapsulant 13 and the bottom surface 113*b* of the adhesive layer 113 are exposed after removal of the temporary carrier 30. Meanwhile, a molding recess 133 of the encapsulant 13** is formed.

Subsequently, a back-etching operation is performed to the base material 106 of the lead frame 10. The package structure 1 of FIG. 1B is formed. A total thickness t of the package structure 1 depends on a thickness of the electronic component 11 and a thickness of encapsulant 13. For example, the total thickness of the package structure 1 is determined by the maximum thickness of the encapsulant 13 (e.g., a distance between a top surface of the encapsulant 13 and a bottom surface **13*b*1 of the encapsulant 13**.

A plurality of pins 101 with respective curve portions 101 are formed through the back-etching operation. A protruding portion of the encapsulant 13 including a second bottom surface **13*b*2 is formed. The protruding portion of the encapsulant 13 extends beyond the curve portion 101*a* of the pin 101. Meanwhile, a third lateral surface 101*s*3 of the pin 101 and a pin recess 105 are formed. As shown in FIG. 1B, the third lateral surface 101*s*3 of the pin 101 and the first lateral surface 13*s*1 of the encapsulant 13 collectively define a pin recess 105. The pin recess 105 is in communication with the molding recess 133**.

In some embodiments, the package structures 1', 2, 2', and 2" may be formed by operations similar to those of FIGS. 3A through 3H.

FIGS. 4A through 4F illustrate some embodiments of a method of manufacturing the package structure 1" of FIG. 1E according to some embodiments of the present disclosure.

Figure 4A:
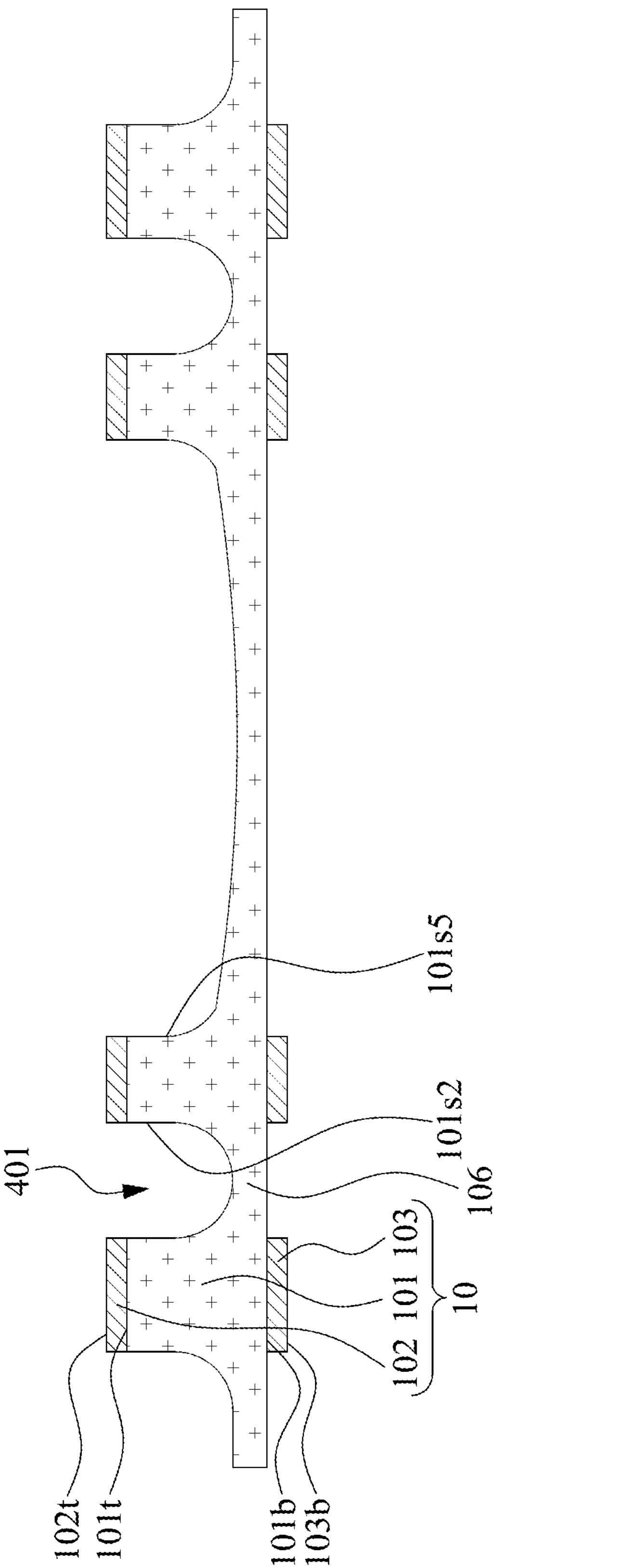
FIG. 4A illustrates a method of manufacturing a package structure according to some embodiments of the present disclosure.

Referring to FIG. 4A, a method of manufacturing the package structure 1" includes providing a lead frame 10. The structure of the lead frame 10 of FIG. 4A is similar to the structure of the lead frame 10 of FIG. 3A, except that a central portion of the lead frame 10 of FIG. 4A is partially etched to form a lateral surface **101*s*5. The central portion of the lead frame 10 remains a portion of the base material 106. Similar to empty space 301 of FIG. 3A, an empty space 401** is formed by an etching operation.

Figure 4B:
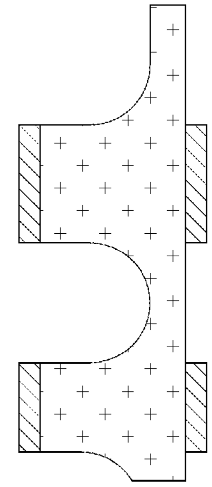
FIG. 4B illustrates a method of manufacturing a package structure according to some embodiments of the present disclosure.
Figure 4B:
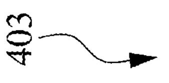
Figure 4B:
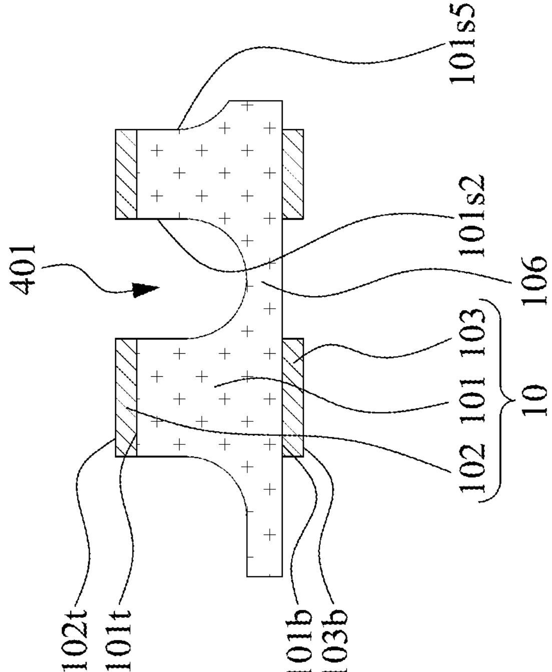

Referring to FIG. 4B, similar to the structure of FIG. 3C, a punch operation is performed to form an accommodation space 403.

Figure 4C:
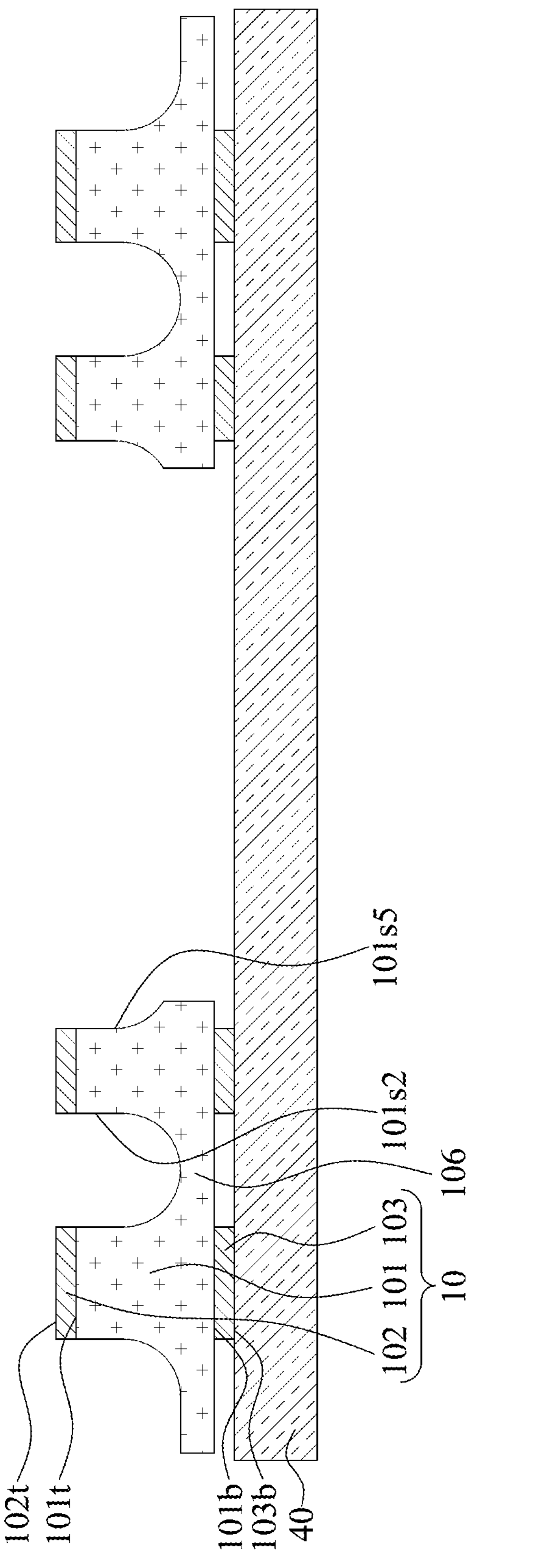
FIG. 4C illustrates a method of manufacturing a package structure according to some embodiments of the present disclosure.
Figure 4D:
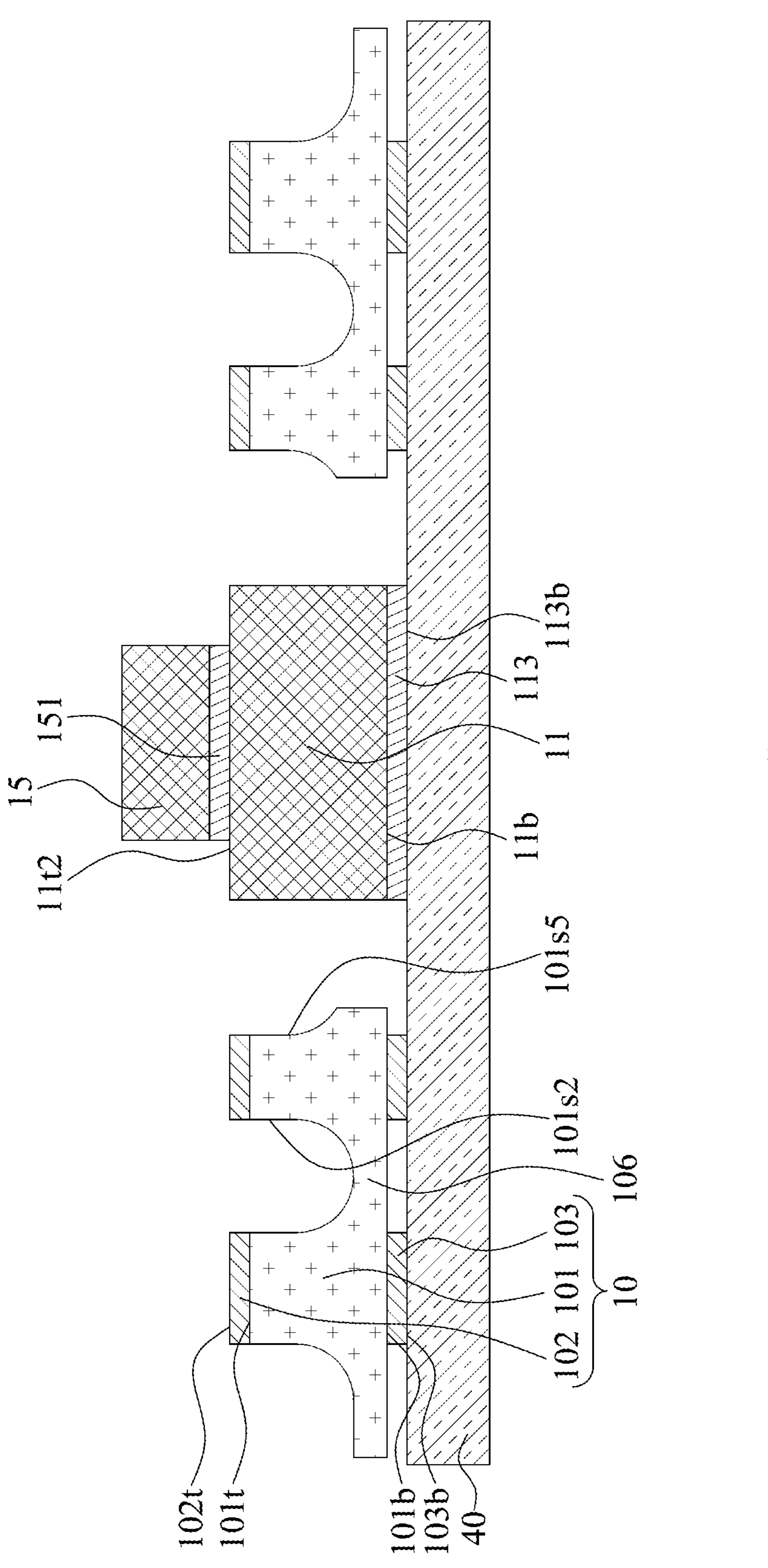
FIG. 4D illustrates a method of manufacturing a package structure according to some embodiments of the present disclosure.
Figure 4E:
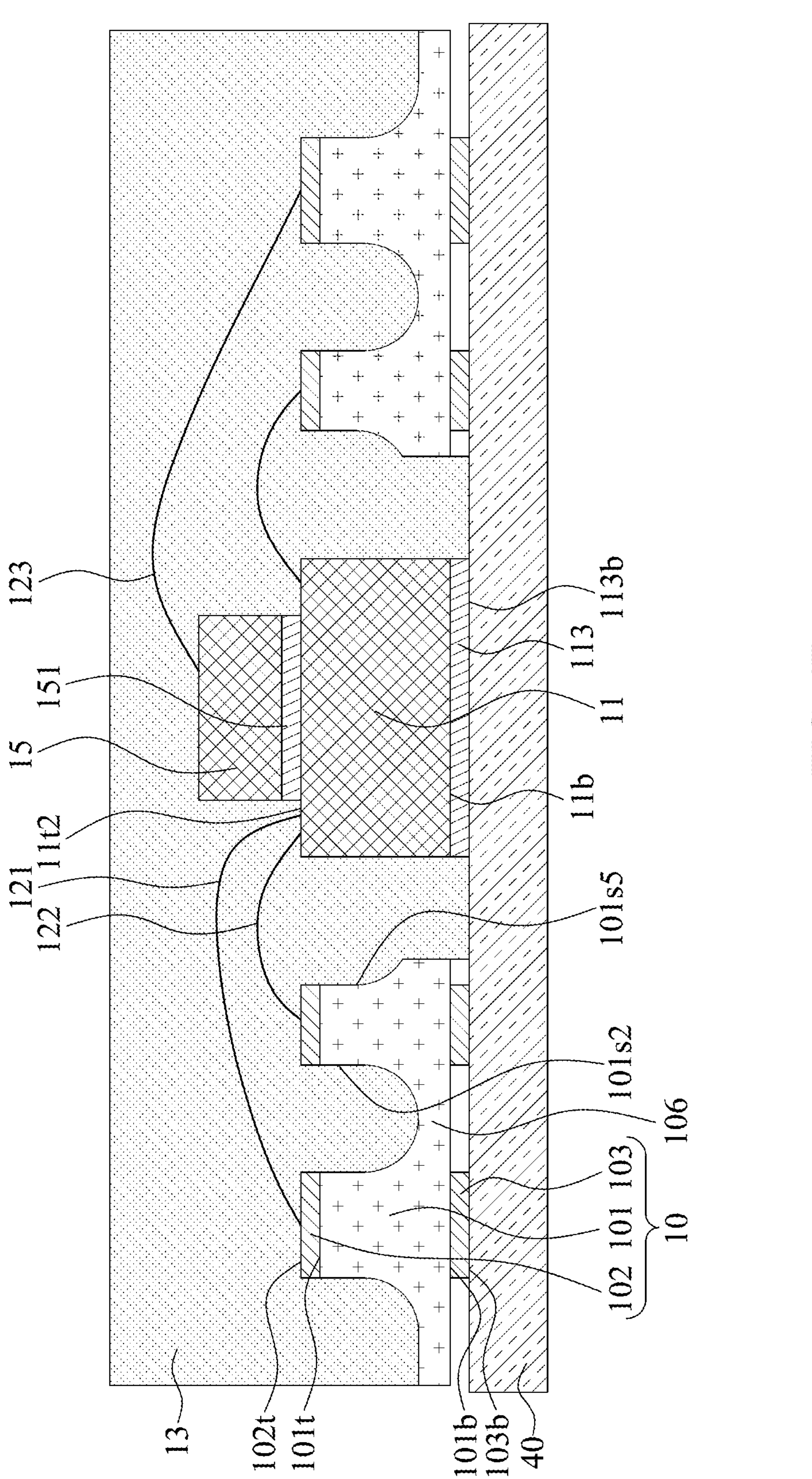
FIG. 4E illustrates a method of manufacturing a package structure according to some embodiments of the present disclosure.

Referring to FIGS. 4C through 4E, the operations of FIGS. 4C through 4E are similar to those of FIGS. 3D through 3H, except that a patterned conductive pad 103 of the lead frame 10 of FIGS. 4C through 4E is disposed over a carrier 40. For example, FIG. 4C shows an attaching operation. FIG. 4D shows a die attaching operation. FIG. 4E shows a molding operation.

Figure 4F:
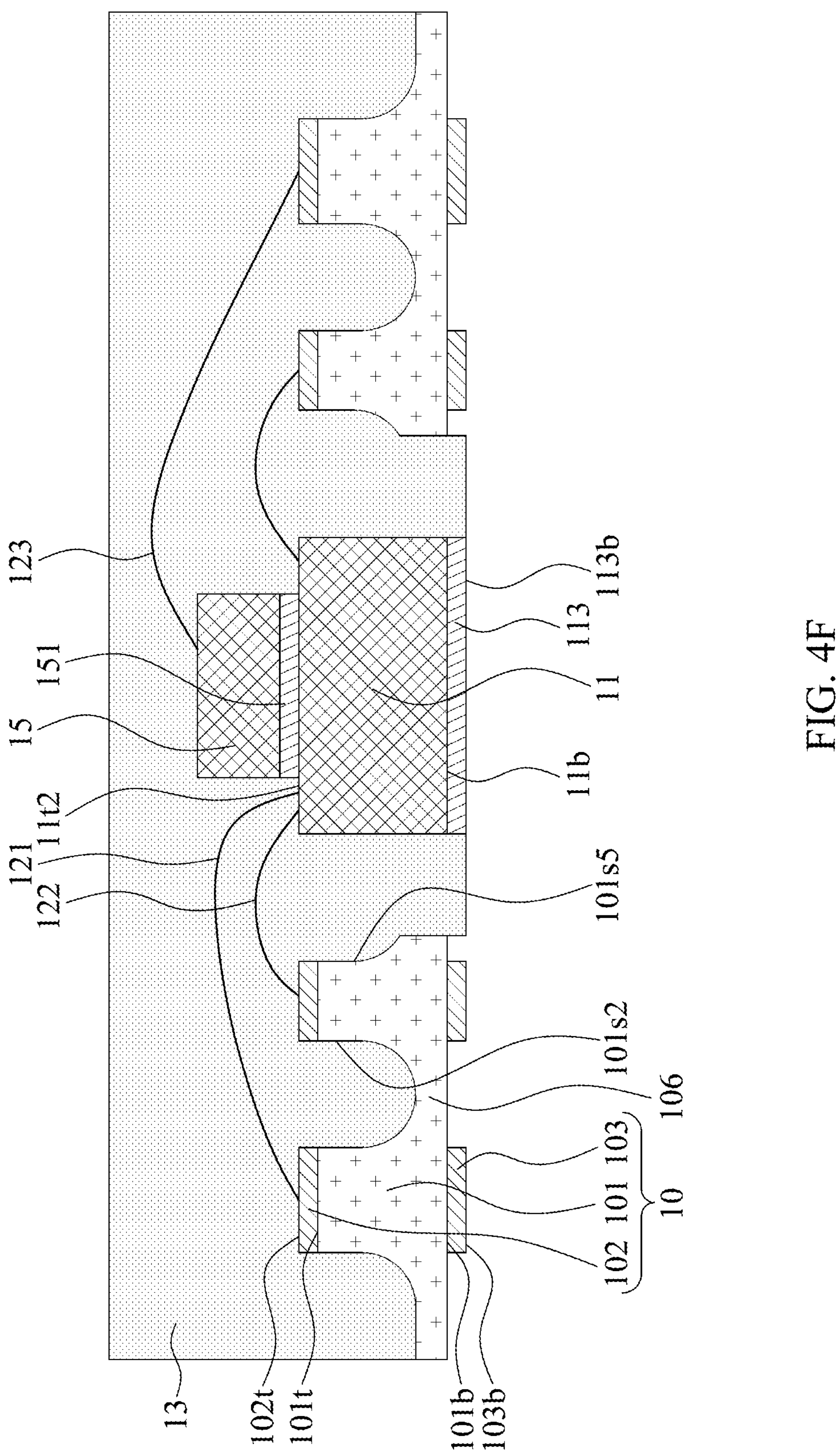
FIG. 4F illustrates a method of manufacturing a package structure according to some embodiments of the present disclosure.

Referring to FIG. 4F, de-carrier operation is performed. Subsequently, a back etching operation is performed to form a plurality of pins 101 and expose a back surface of an encapsulant 13. After performing the back etching operation, the package structure 1" is formed.

FIGS. 5A through 5E illustrate some embodiments of a method of manufacturing the package structure 2 according to some embodiments of the present disclosure.

Figure 5A:
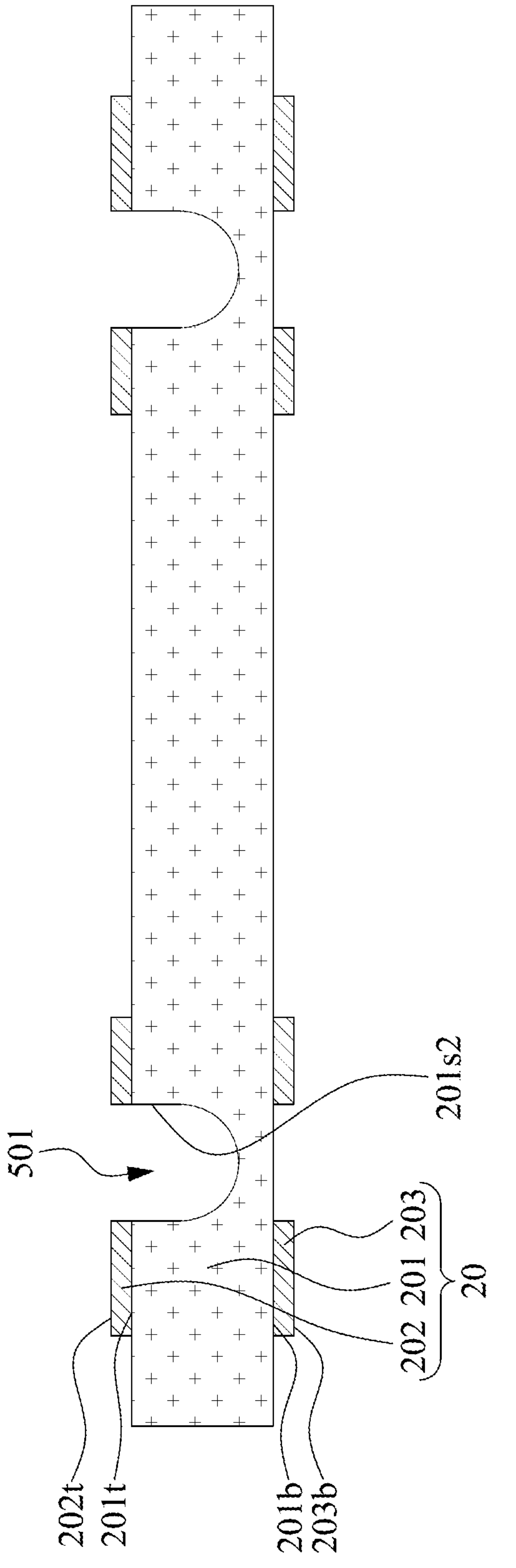
FIG. 5A illustrates a method of manufacturing a package structure according to some embodiments of the present disclosure.

Referring to FIG. 5A, a method of manufacturing the package structure 2 includes providing a lead frame 20. The lead frame 20 includes a pin 201, a patterned conductive pad 202, and a patterned conductive pad 203. The patterned conductive pad 202 is formed on a top surface 201*t* of the lead frame 20. The patterned conductive pad 202 has a top surface 202*t*. The patterned conductive pad 203 is formed on a bottom surface 201*b* of the lead frame 20. The patterned conductive pad 203 has a bottom surface 203*b*. The patterned conductive pad 203 may be used for the following soldering operation. The lead frame 20 includes a plurality of openings 401 formed by an etching operation. The opening 401 has a lateral surface 201*s*2. In some embodiments, the patterned conductive pad 202 and the patterned conductive pad 203 may be conductive pads.

Figure 5B:
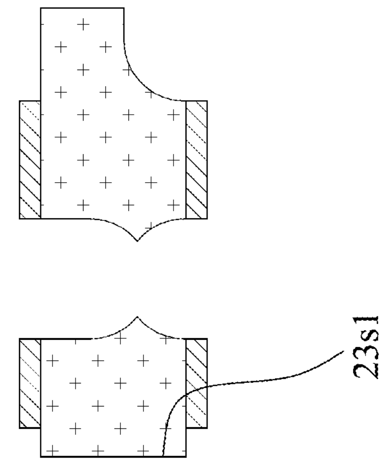
FIG. 5B illustrates a method of manufacturing a package structure according to some embodiments of the present disclosure.
Figure 5B:
Figure 5B:
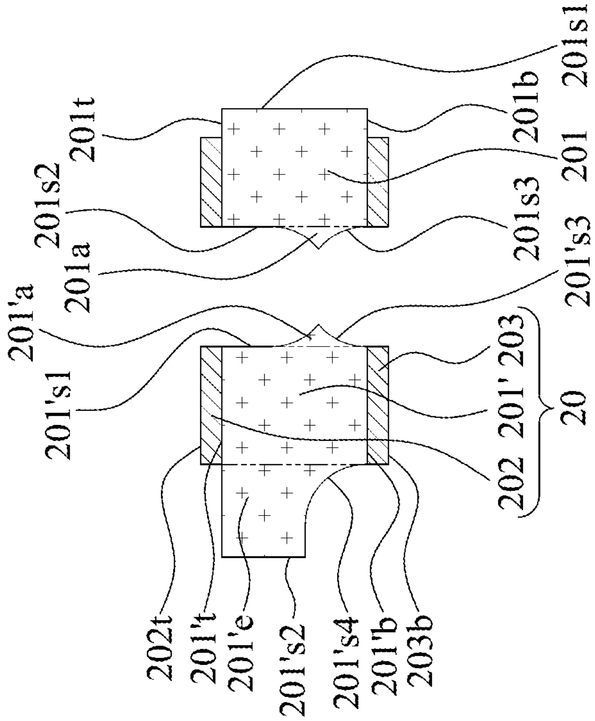

Referring to FIG. 5B, a space 403 is formed by a punch operation or an etching operation. The space 403 is defined by the lead frame 20. A central portion of the lead frame 20 is removed by the punch operation one time for saving costs. A back etching operation is performed to form at least one pin 201 closest to the space 403 and at least one pin 201' adjacent to the at least one pin 201.

The pin 201 has the lateral surface 201*s*1, a lateral surface 201*s*2, and a lateral surface 201*s*3. The pin 201' has the lateral surface 201'*s*1, a lateral surface 201'*s*2, a lateral surface 201'*s*3, and a lateral surface 201'*s*4. The pin 201 includes a lateral surface 201*s*1 after the punch operation. The pin 201 includes a lateral surface 201*s*3 after the back etching operation. The pin 201' includes lateral surfaces 201'*s*3, 201'*s*4 after the back etching operation.

The pin 201 has a curve portion 201*a* defined by the lateral surface 201*s*2 and the lateral surface 201*s*3. The pin 201' has a curve portion 201'*a* defined by the lateral surface 201'*s*1 and the lateral surface 201'*s*3.

A roughness of the lateral surface 201*s*1 of the lead frame 20 is greater than a roughness of the lateral surface 201*s*2 of the lead frame 20 due to an operation difference between the punch operation and the etching operation.

Figure 5C:
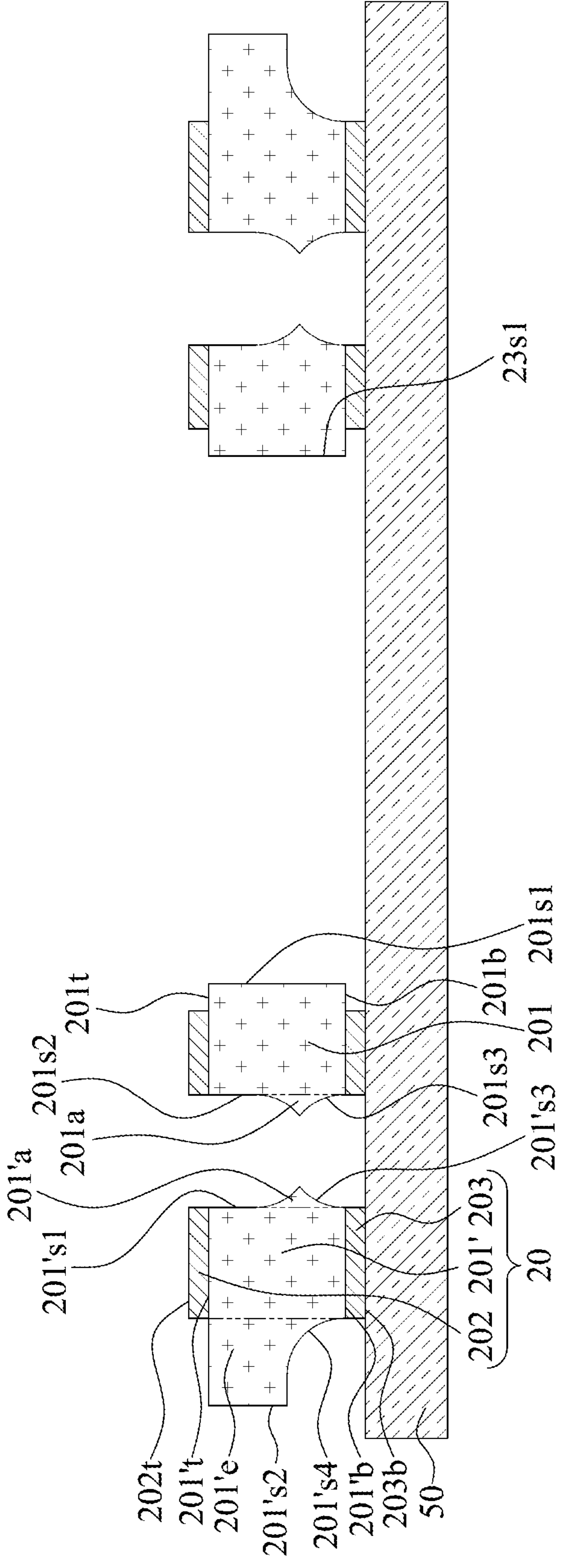
FIG. 5C illustrates a method of manufacturing a package structure according to some embodiments of the present disclosure.

Referring to FIG. 5C, the lead frame 20 is disposed above a temporary carrier 40. In some embodiments, the temporary carrier 40 may be a tape. The conductive pads 203 of the lead frame 20 are over the temporary carrier 40.

Figure 5D:
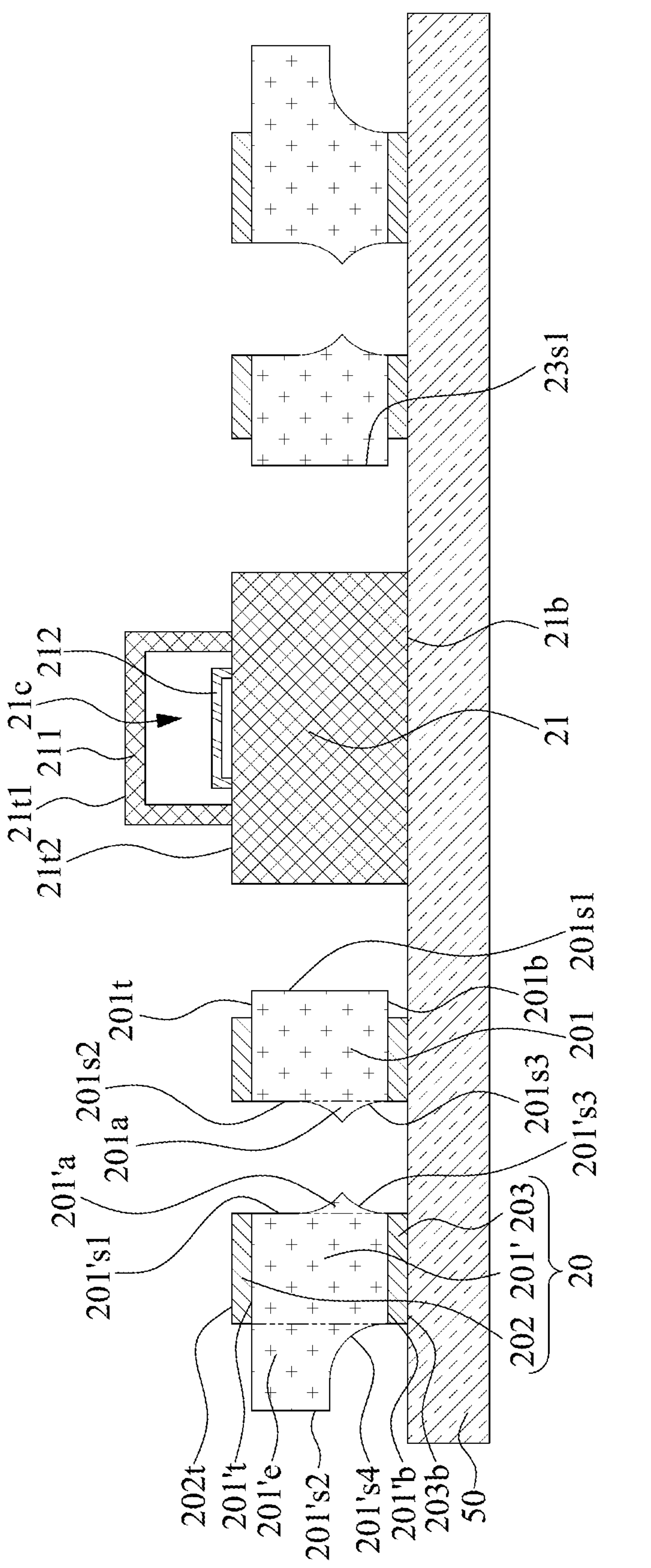
FIG. 5D illustrates a method of manufacturing a package structure according to some embodiments of the present disclosure.

Referring to FIG. 5D, an electronic component 21 is attached to the temporary carrier 40. A bottom surface 21*b* of the electronic component 21 and the bottom surface 203*b* of the conductive pad 203 are substantially coplanar. The electronic component 21 has a cap 211 and a membrane 212. The cap 211 defines a cavity 21*c* to accommodate the membrane 212. The electronic component 21 includes a first top surface 21*t*1, a second top surface 21*t*2, and a bottom surface 21*b* opposite to the second top surface 21*t*2, wherein the second top surface 21*t*2 is between the first top surface 21*t*1 and the bottom surface 21*b*. The second top surface 21*t*2 of the electronic component 21 and the top surface 202*t* of the conductive pad 202 are substantially coplanar. In some embodiments, the electronic component 21 may include, e.g., a MEMS package, a MEMS microphone, or a MEMS gas sensor.

Figure 5E:
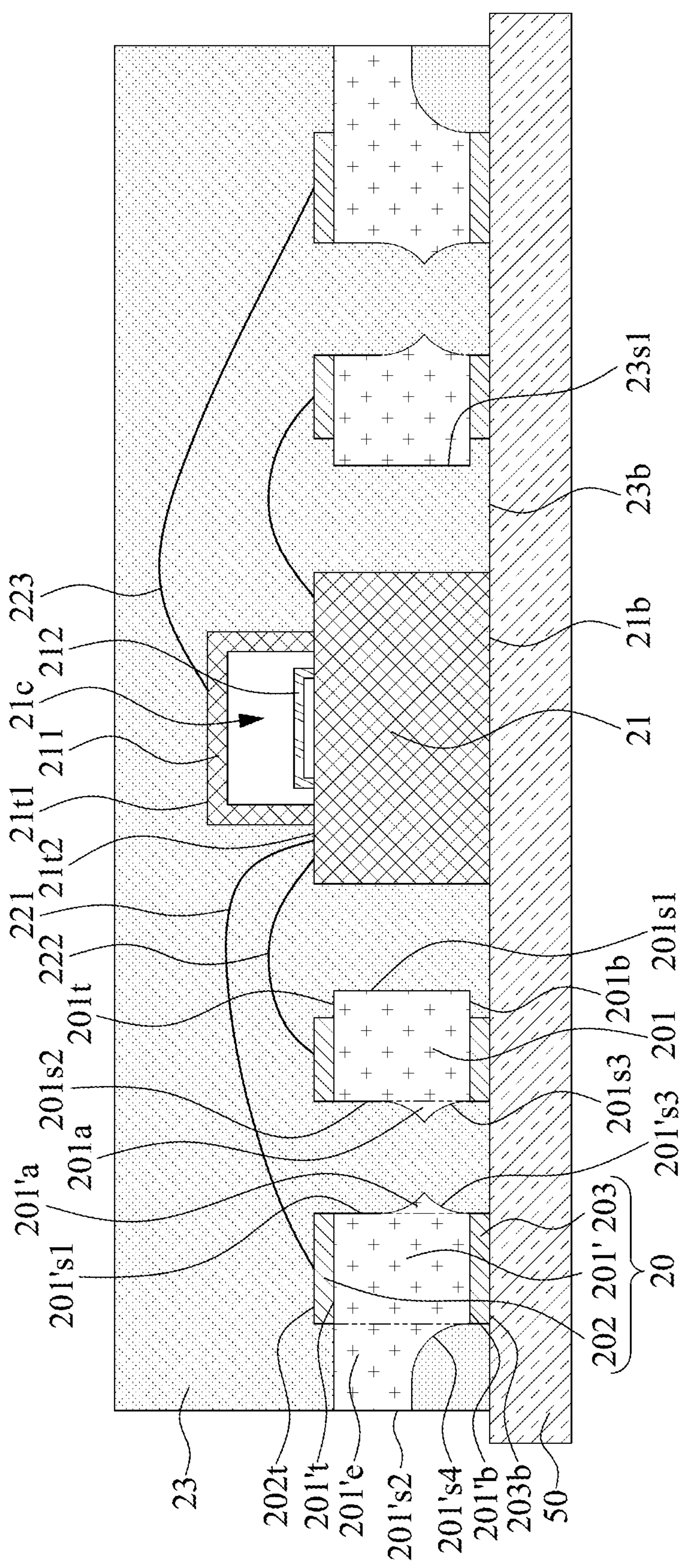
FIG. 5E illustrates a method of manufacturing a package structure according to some embodiments of the present disclosure.

Referring to FIG. 5E, bonding operations and molding operations of FIG. 5E are similar to those of FIG. 3G. After the bonding operations and molding operations are completed, the carrier 40 is removed to form the package structure 2.

Figure 6A:
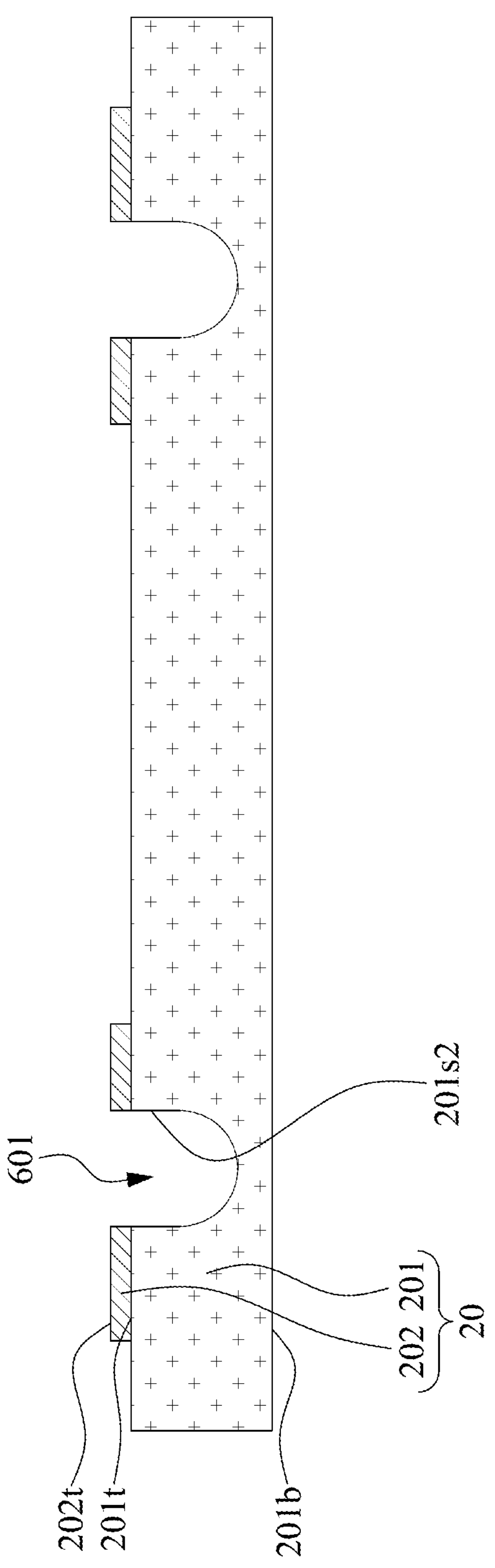
FIG. 6A illustrates a method of manufacturing a package structure according to some embodiments of the present disclosure.
Figure 6B:
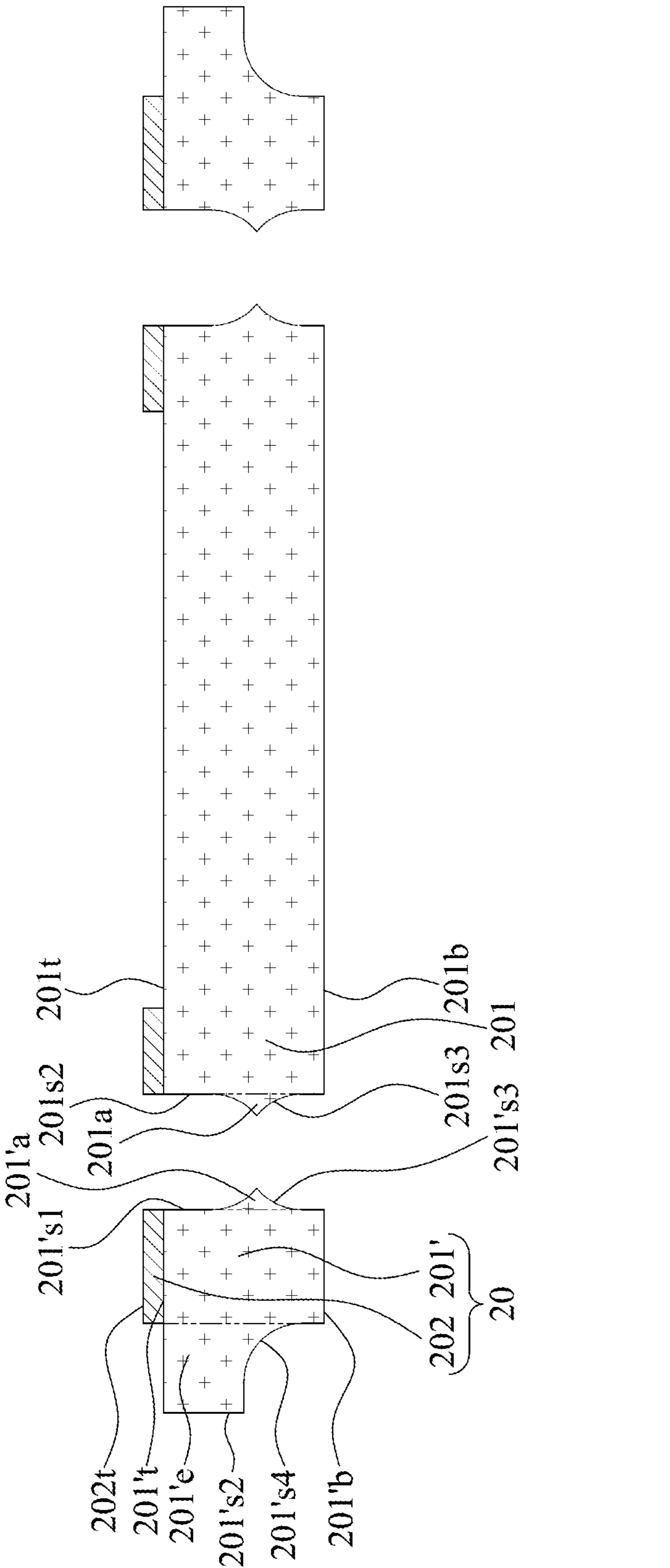
FIG. 6B illustrates a method of manufacturing a package structure according to some embodiments of the present disclosure.
Figure 6C:
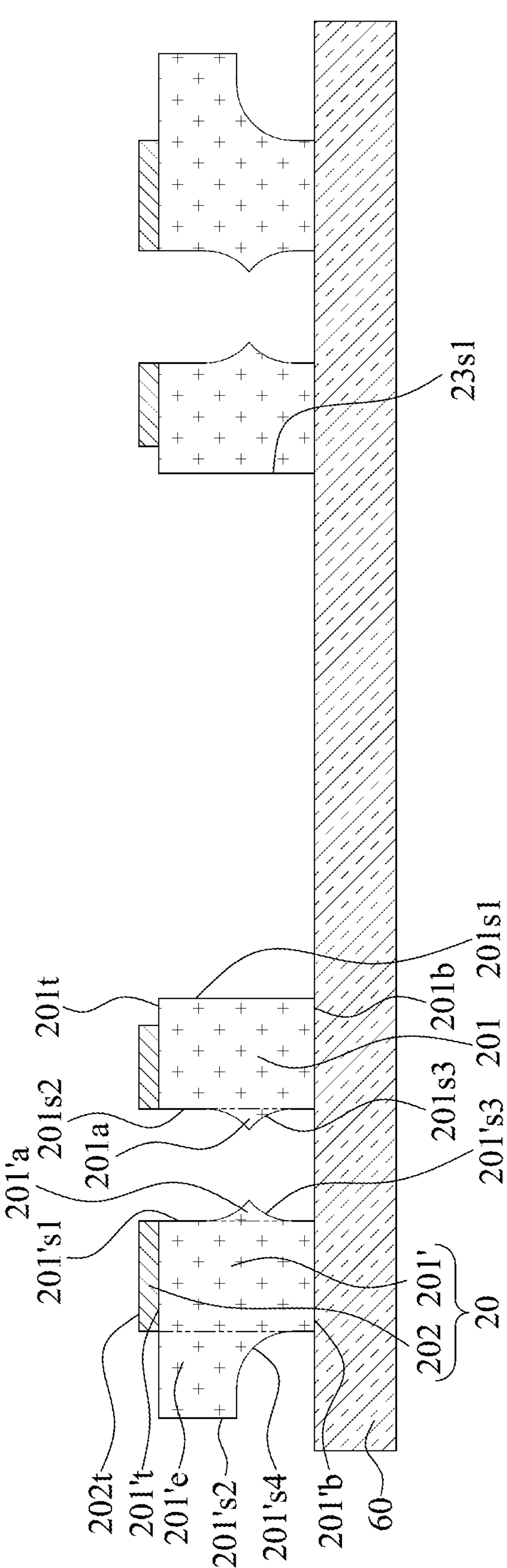
FIG. 6C illustrates a method of manufacturing a package structure according to some embodiments of the present disclosure.
Figure 6D:
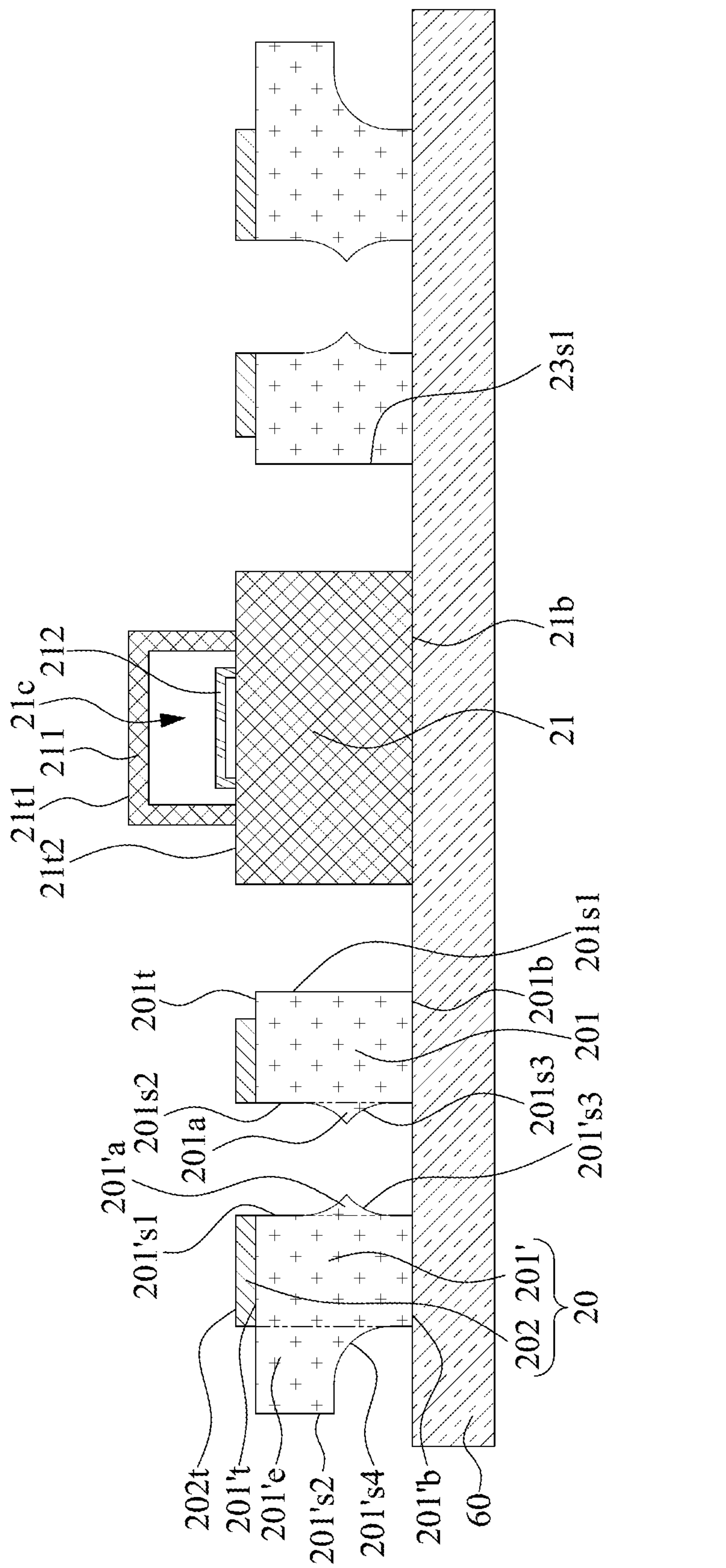
FIG. 6D illustrates a method of manufacturing a package structure according to some embodiments of the present disclosure.

FIGS. 6A through 6E illustrate some embodiments of a method of manufacturing the package structure 2" according to some embodiments of the present disclosure. The operations of FIGS. 6A through 6E are similar to those of FIGS. 5A through 5E, except that the lead frame 20 of FIGS. 6A through 6E has no patterned conductive pad 203. For example. FIG. 6A shows providing a lead frame 20. FIG. 6B shows a back-etching operation. FIG. 6C shows an attaching operation. FIG. 6D shows a die attaching operation.

Figure 6E:
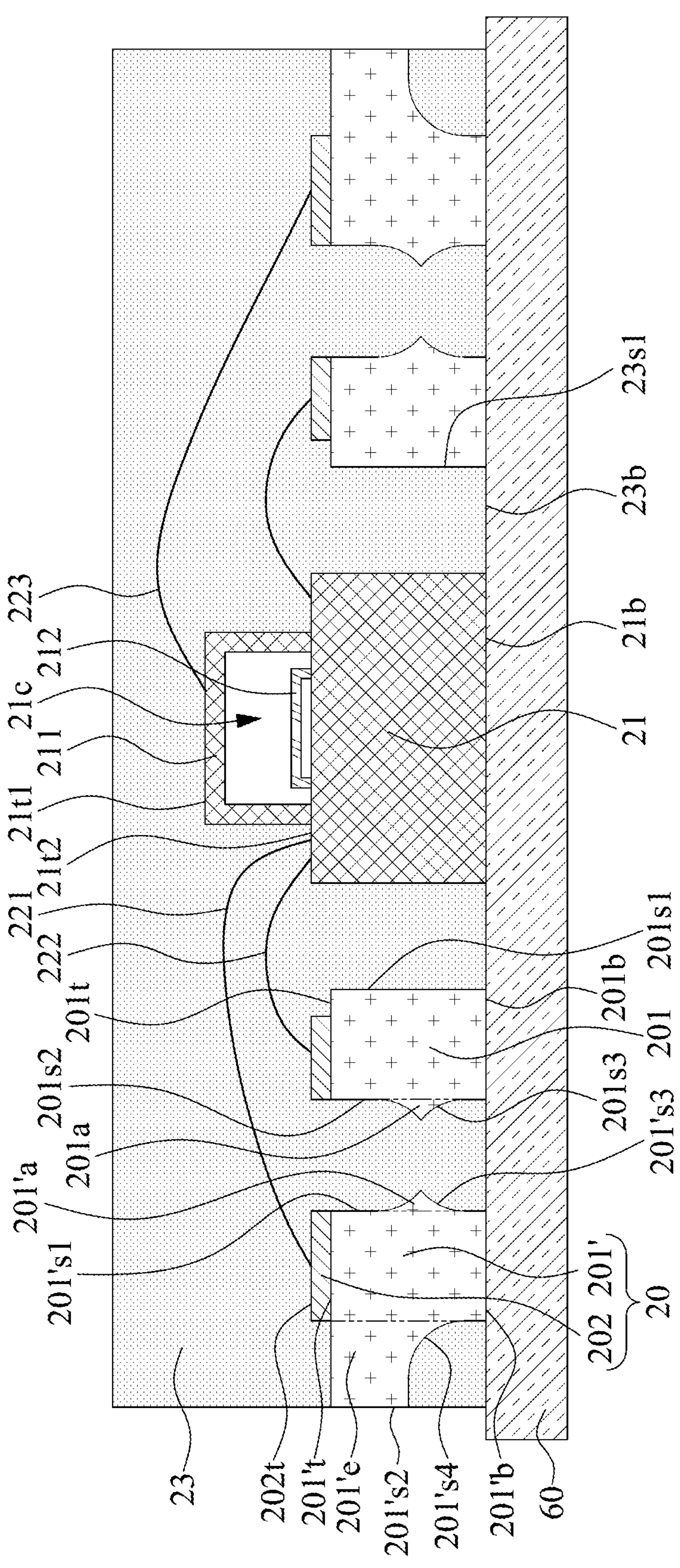
FIG. 6E illustrates a method of manufacturing a package structure according to some embodiments of the present disclosure.
Figure 6F:
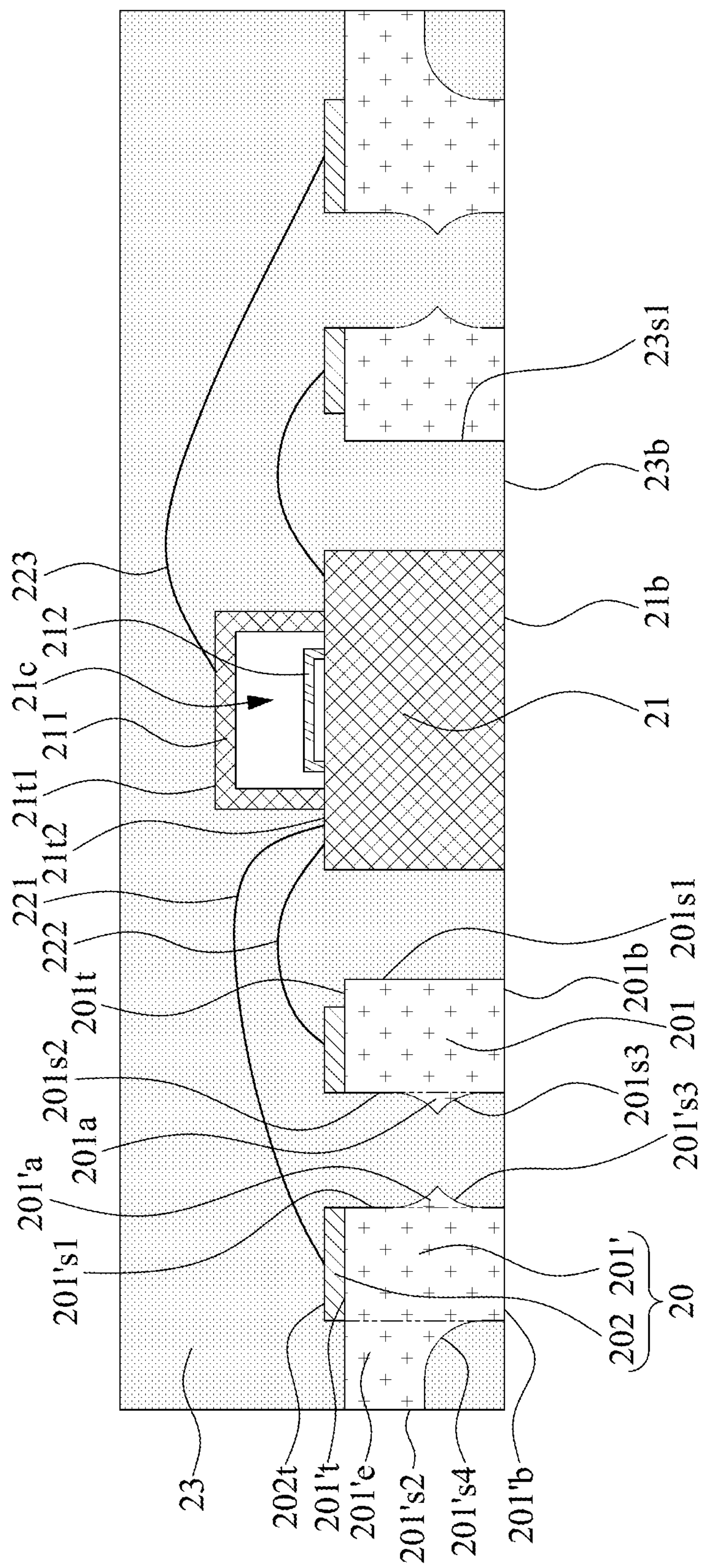
FIG. 6F illustrates a method of manufacturing a package structure according to some embodiments of the present disclosure.

Referring to FIG. 6E, a respective conductive pad 203' is correspondingly formed on a back surface 201*b* of a pin 201 or a back surface 201'*b* of a pin 201' by a soldering operation. A bottom surface 203'*b* of the conductive pad 203' is lower than a bottom surface 23*b* of an encapsulant 23. In some embodiments, the conductive pad 203' may include a solder material, such as tin (Sn). After the formation of the conductive pad 203', the package structure 2" is formed.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A package structure, comprising:

a lead frame including a first pin, a second pin, a first conductive pad disposed on the first pin, and a second conductive pad disposed on the second pin;

an electronic component; and a conductive wire physically and electrically connecting the electronic component to the lead frame, wherein an elevation of a first end of the conductive wire is substantially equal to an elevation of a second end of the conductive wire, and wherein a first surface area of the first conductive pad is less than a second surface area of the second conductive pad from a top view.

2. The package structure of claim 1, wherein a projection of the electronic component is free from overlapping a projection of the lead frame in the top view.

3. The package structure of claim 2, further comprising an adhesive layer on a bottom surface of the electronic component and exposed to air.

4. The package structure of claim 1, further comprising an encapsulant encapsulating the electronic component, wherein a first bottom surface of the encapsulant is substantially aligned with a bottom surface of the electronic component.

5. The package structure of claim 4, wherein the first bottom surface of the encapsulant is substantially aligned with a bottom surface of the lead frame.

6. The package structure of claim 4, wherein the first pin of the lead frame has a first curve portion and the second pin of the lead frame has a second curve portion, and wherein an imaginary line between the first curve portion and the second curve portion is between the top surface of the electronic component and a bottom surface of the electronic component.

7. The package structure of claim 4, wherein the encapsulant further includes a second bottom surface, and an elevation of the second bottom surface of the encapsulant is different from an elevation of the first bottom surface of the encapsulant.

8. The package structure of claim 7, wherein the elevation of the second bottom surface of the encapsulant is higher than the elevation of the first bottom surface of the encapsulant.

9. The package structure of claim 7, wherein a profile of a portion of the encapsulant filled between adjacent pins of the lead frame is conformal to the pins of the lead frame and the shape of portion of the encapsulant is curved.

10. The package structure of claim 7, wherein the portion of the encapsulant extends beyond a curve portion of a pin of the lead frame.

11. The package structure of claim 4, wherein the first pin has a top surface, a bottom surface opposite to the top surface, a first lateral surface connected to the top surface, and a second lateral surface connected between the first lateral surface and the bottom surface, the first lateral surface is a vertical surface and in contact with the encapsulant and the second lateral surface is a curved surface and spaced apart from the encapsulant, and wherein the first lateral surface and the second lateral surface of the first pin face the electronic component.

12. The package structure of claim 1, wherein the electronic component includes a cap and a membrane covered by the cap, and wherein an elevation of a top surface of the membrane is higher than the elevation of the first end of the conductive wire.

13. The package structure of claim 12, wherein the lead frame has an outermost pin relative to the first pin and the second pin, and wherein the package structure further comprises a second conductive wire electrically connecting a top surface of the cap to a top surface of the outermost pin.

14. The package structure of claim 1, wherein the first pin is adjacent to the electronic component and the second pin is far away from the electronic component.

15. The package structure of claim 14, wherein the first pin misaligns the second pin from the top view.

16. The package structure of claim 1, wherein a first width of the first conductive pad is less than a second surface width of the second conductive pad from the top view.

17. The package structure of claim 1, wherein the first conductive pad partially covers a top surface of the first pin.

18. The package structure of claim 17, wherein the second conductive pad completely covers a top surface of the second pin.

19. A package structure, comprising:

an electronic component;

at least one pin disposed around the electronic component, wherein the at least one pin has a top surface, a bottom surface opposite to the top surface, a first lateral surface extending between the top surface and the bottom surface, and a second lateral surface opposite to the first lateral surface, wherein the first lateral surface faces the electronic component; and an encapsulant encapsulating the at least one pin and the electronic component, wherein a roughness of the first lateral surface of the at least one pin is greater than a roughness of the second lateral surface of the at least one pin, and wherein the at least one pin further comprises a third lateral surface connected to the first lateral surface of the at least one pin, and the third lateral surface of the at least one pin includes a curved surface, wherein the encapsulant has a first lateral surface and a second lateral surface, and the first lateral surface of the encapsulant is a vertical surface and the second lateral surface of the encapsulant is a curved surface, and wherein the third lateral surface of the at least one pin defines a first recess and the second lateral surface of the encapsulant defines a second recess, and a size of the first recess is greater than a size of the second recess, and wherein the first recess faces the second recess.

20. The package structure of claim 19, wherein the first lateral surface of the at least one pin is a vertical surface and the second lateral surface of the at least one pin includes a curved surface.

21. The package structure of claim 19, wherein the roughness of the first lateral surface of the at least one pin is greater than a roughness of the third lateral surface of the at least one pin.

22. The package structure of claim 19, wherein the encapsulant is in contact with the first lateral surface of the at least one pin and spaced apart from the third lateral surface of the at least one pin.

23. The package structure of claim 19, wherein the electronic component includes a cap and a membrane covered by the cap, and wherein an elevation of a top surface of the membrane is higher than an elevation of the top surface of the at least one pin.

* * * * *